United States Patent [19]
Ozawa et al.

[11] Patent Number: 5,869,858
[45] Date of Patent: Feb. 9, 1999

[54] SEMICONDUCTOR DEVICE FOR REDUCING VARIATIONS IN CHARACTERISTICS OF THE DEVICE

[75] Inventors: Yoshio Ozawa; Shigehiko Saida, both of Yokohama, Japan

[73] Assignee: Kabushiki Kaisha Toshiba, Kawasaki, Japan

[21] Appl. No.: 614,538

[22] Filed: Mar. 13, 1996

[30] Foreign Application Priority Data

Mar. 14, 1995 [JP] Japan ................................ 7-054791
Mar. 8, 1996 [JP] Japan ................................ 8-051950

[51] Int. Cl.$^6$ ..................... H01L 27/108; H01L 29/76; H01L 29/94; H01L 31/119
[52] U.S. Cl. ..................... 257/296; 257/288; 257/316; 257/622
[58] Field of Search ..................... 257/296, 298, 257/288, 301, 302, 622, 623, 316

[56] References Cited

U.S. PATENT DOCUMENTS

| | | | |
|---|---|---|---|
| 4,262,296 | 4/1981 | Shealy et al. | 357/55 |
| 4,897,702 | 1/1990 | Sunouchi | 357/23.6 |
| 5,307,310 | 4/1994 | Narita | 365/149 |
| 5,471,423 | 11/1995 | Iwasa | 365/185.01 |
| 5,563,105 | 10/1996 | Dobuzinsky et al. | 437/240 |
| 5,563,762 | 10/1996 | Leung et al. | 361/301.4 |

FOREIGN PATENT DOCUMENTS 62-43180   2/1987   Japan .

OTHER PUBLICATIONS

Folberth, O. G. "Transistor with Tunnel Gate", IBM Tech. Disc. Bull., vol. 16, No. 12, p. 3953, May 1974.
Kunio Nakamura, et al., "Buried Isolation Capacitor (BIC) Cell for Megabit MOS Dynamic RAM", IEEE IEDM Tech Digest, (pp. 236–239), Dec. 1984.
K. Sekiya, et al., "Trench Self–Aligned Eprom Technology", Symposium on VLSI Technology Technical Digest, (pp. 87–88), 1986.
W.F. Richardson, et al., "A Trench Transistor Cross–Point Dram Cell", IEEE IEDM Tech Digest, (pp. 714–717), Dec. 1985.
M. Sakamoto, et al., "Buried Storage Electrode (BSE) Cell for Megabit Drams", IEEE IEDM Tech Digest, (pp. 710–713), Dec. 1985.
N. Lu, et al., "The SPT Cell—A New Substrate–Plate Trench Cell for Drams", IEEE IEDM Tech Digest, (pp. 771–772), Dec. 1985.
Yosiaki S. Hisamune, et al., "A 3.6 $\mu m^2$ Memory Cell Structure for 16MB EPROMS", IEEE IEDM Tech Digest, (pp. 583–586), 1989.

*Primary Examiner*—Olik Chaudhuri
*Assistant Examiner*—Howard Weiss
*Attorney, Agent, or Firm*—Oblon, Spivak, McClelland, Maier & Neustadt, P.C.

[57] ABSTRACT

A semiconductor device comprises a substrate, a first conductive layer formed on the substrate and comprising a first layer and a second layer formed on the first layer and having at least one of a convex and a concave, an insulating layer formed on the one of the convex and the concave of the first conductive layer, and a second conductive layer formed opposed to the one of the convex and the concave with the insulating layer interposed therebetween to thereby form a capacitive element with the first conductive layer, the insulating layer having a first region having a first capacitance value per unit area that substantially determines the capacitance value of the capacitive element and a second region having a second capacitance value per unit area that is smaller than the first capacitance value per unit area of the first region, and the second region being formed on the first layer of the conductive layer which is exposed to the one of the convex and the concave.

21 Claims, 12 Drawing Sheets

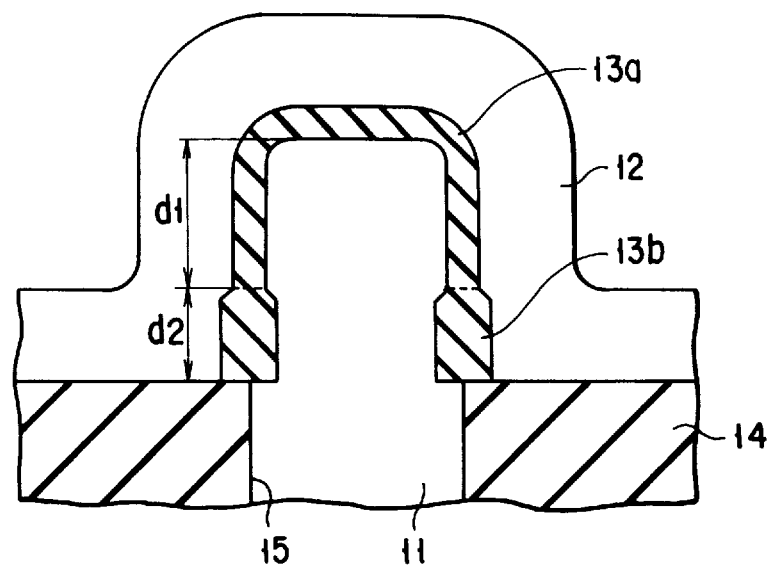
F I G. 1
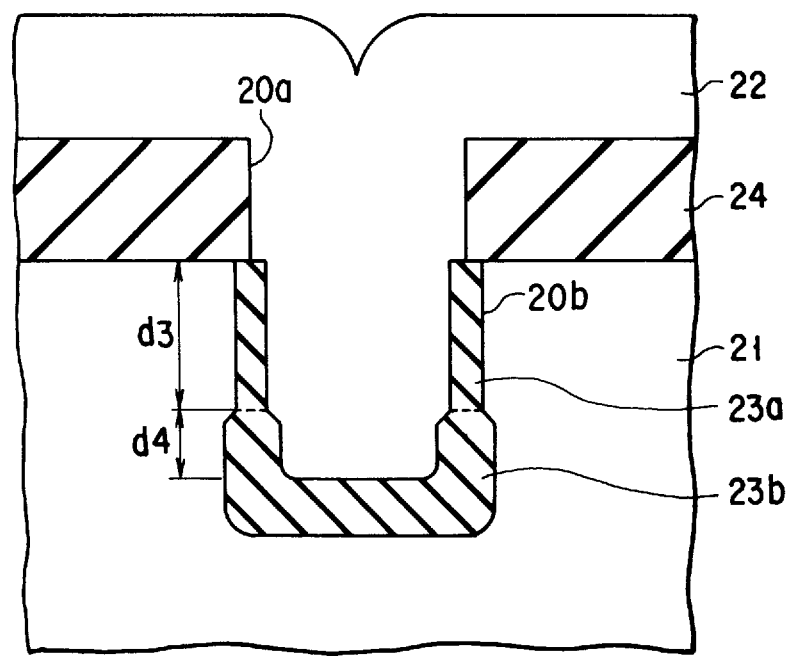
F I G. 2
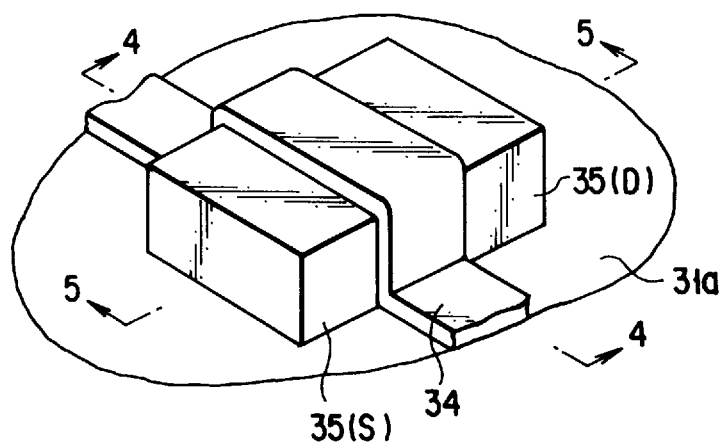
F I G. 3

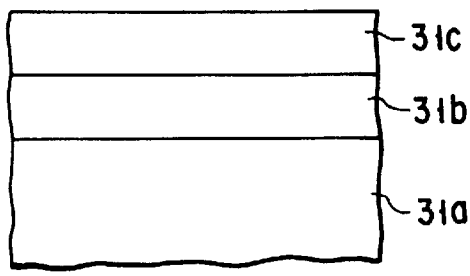
F I G. 4A
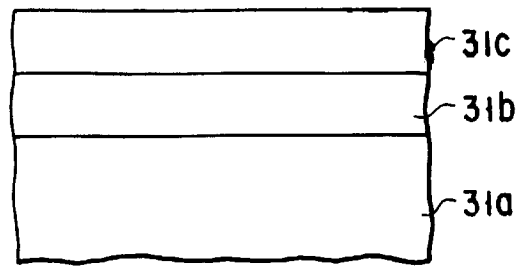
F I G. 5A
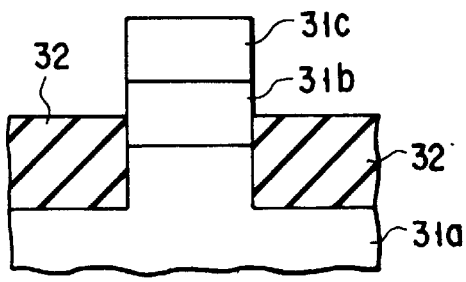
F I G. 4B
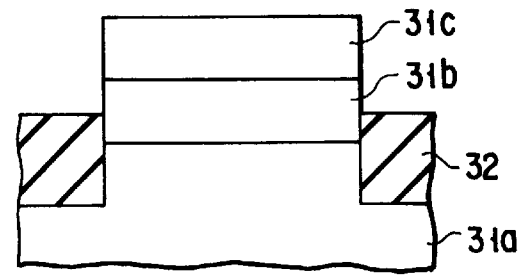
F I G. 5B
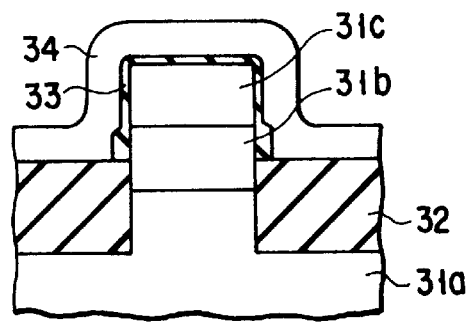
F I G. 4C
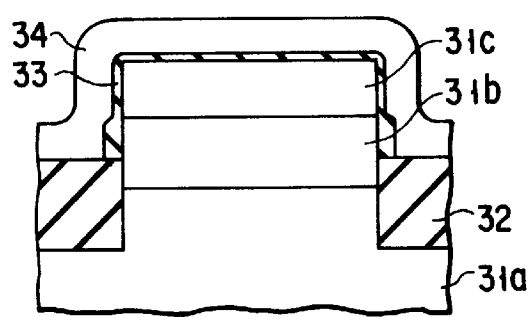
F I G. 5C
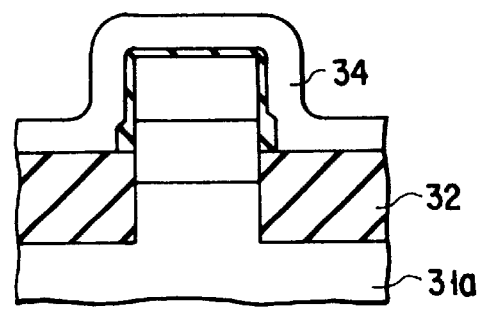
F I G. 4D
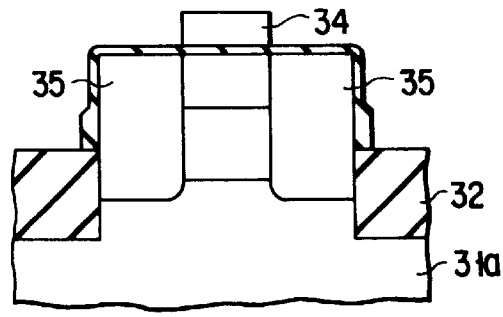
F I G. 5D

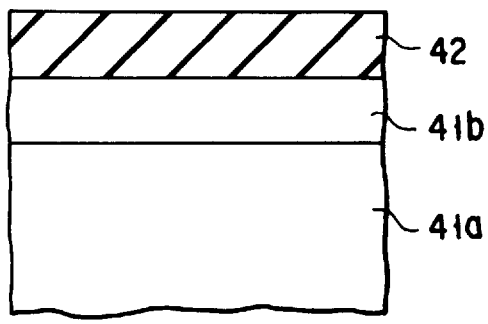
F I G. 6A
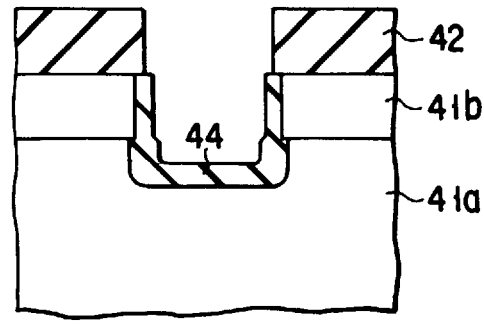
F I G. 6C
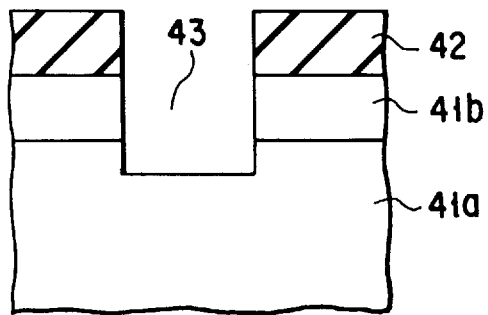
F I G. 6B
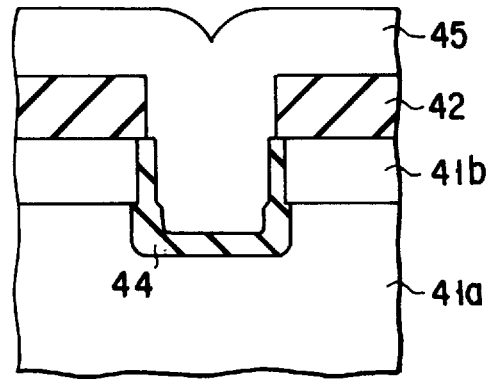
F I G. 6D
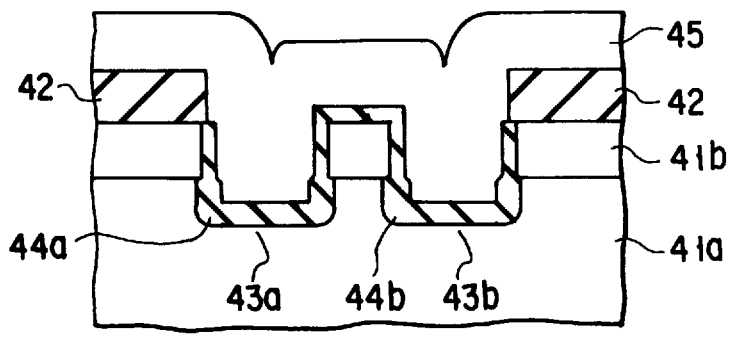
F I G. 7

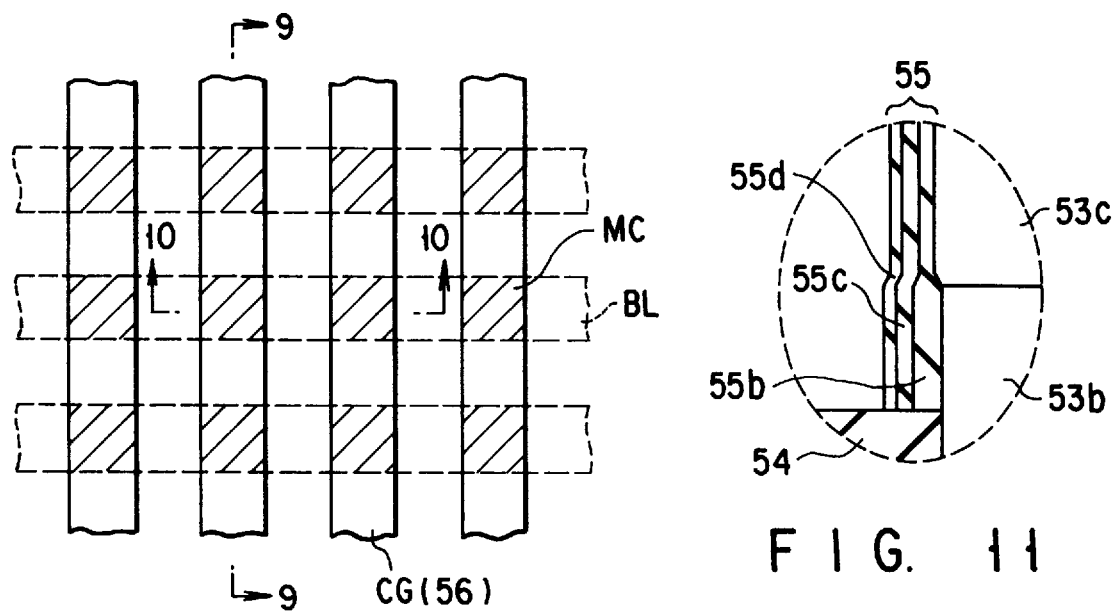
FIG. 8
FIG. 11
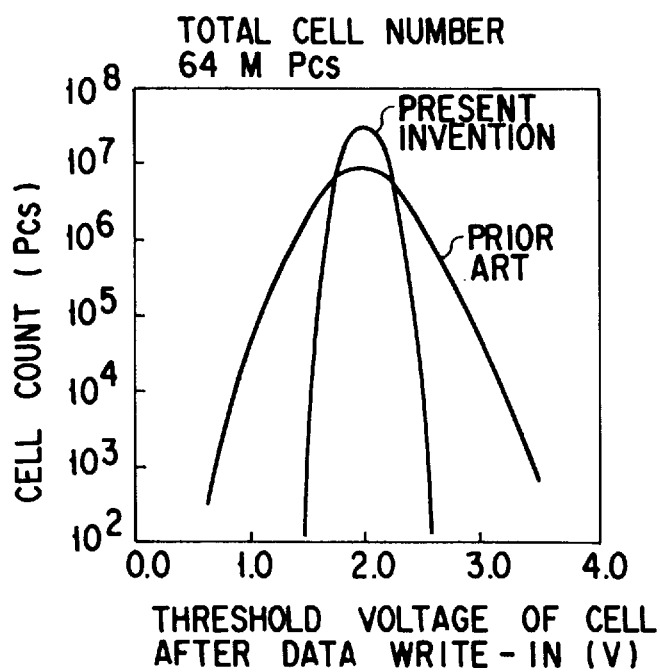
FIG. 12

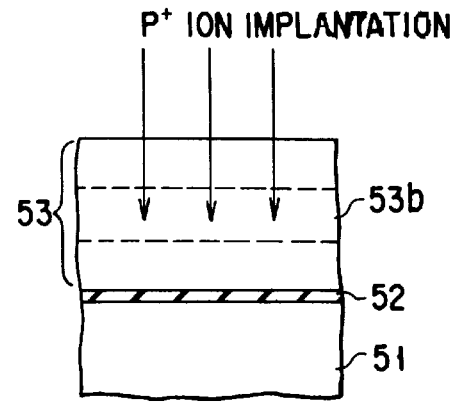
F I G. 13A
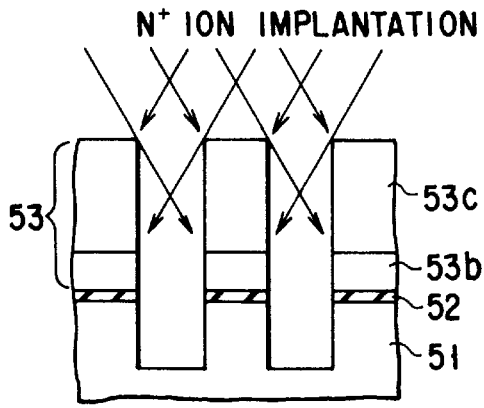
F I G. 13B
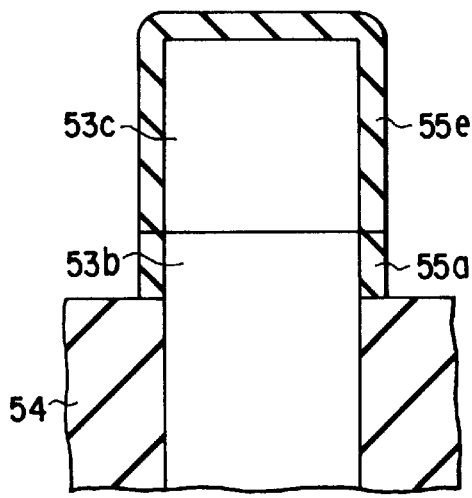
F I G. 14A
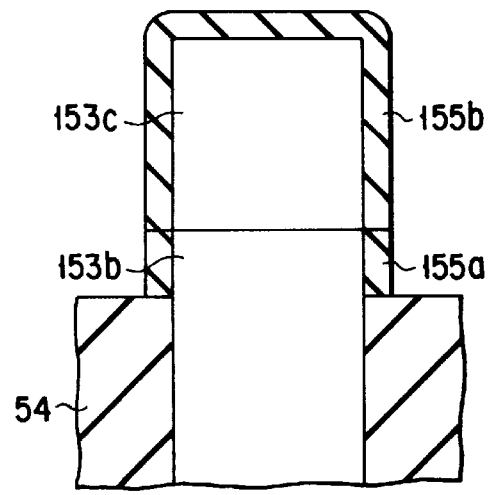
F I G. 14B
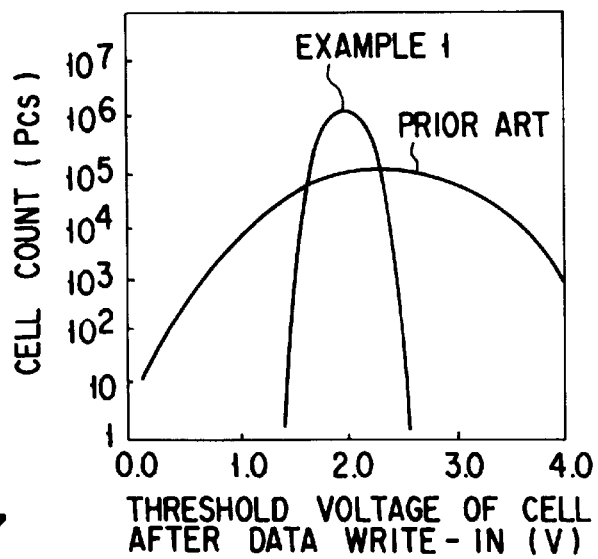
F I G. 17

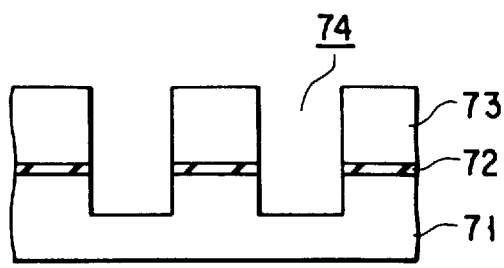
F I G. 18A
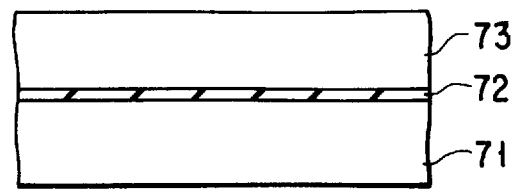
F I G. 19A
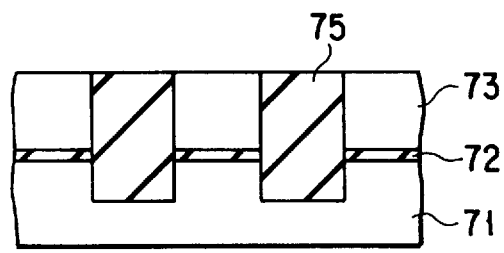
F I G. 18B
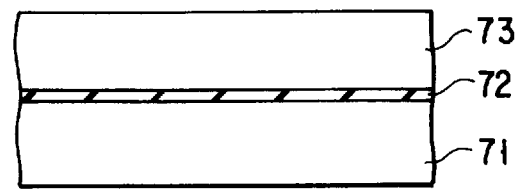
F I G. 19B
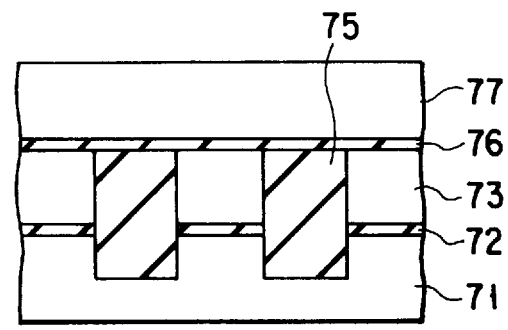
F I G. 18C
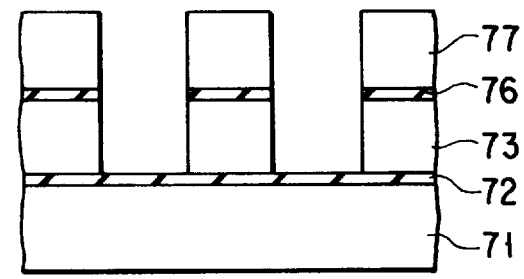
F I G. 19C
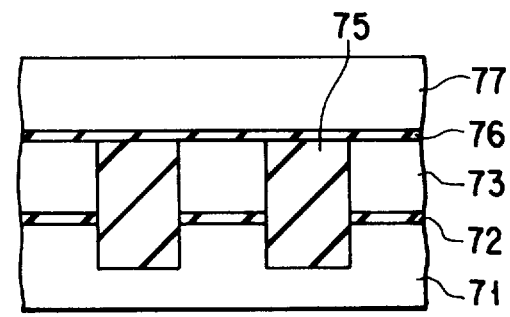
F I G. 18D
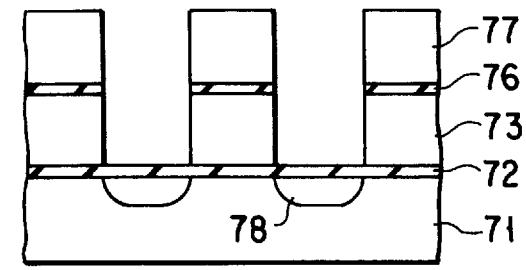
F I G. 19D

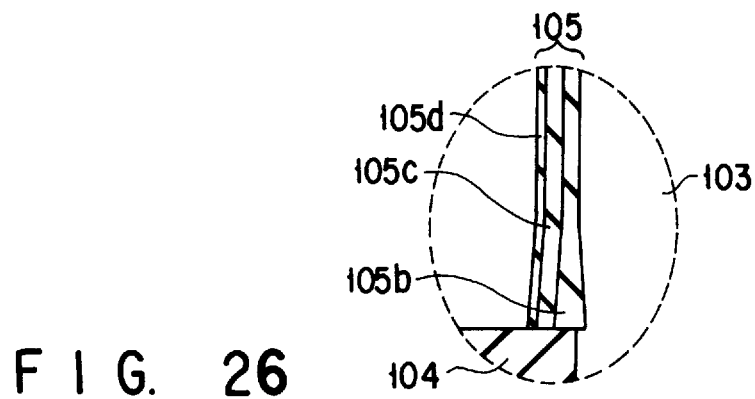
F I G. 26
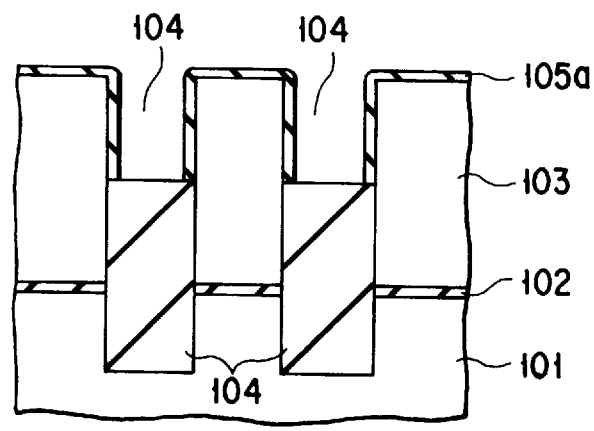
F I G. 27A
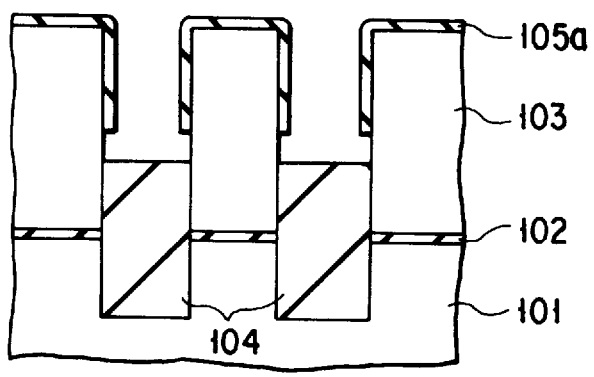
F I G. 27B

SEMICONDUCTOR DEVICE FOR REDUCING VARIATIONS IN CHARACTERISTICS OF THE DEVICE

BACKGROUND OF THE INVENTION

1. Field of the Invention

The invention relates to a semiconductor device, and more specifically to a semiconductor device capable of reducing the variability of characteristics.

2. Description of the Related Art

In recent years, fine structuring of constituent elements in semiconductor devices has been pushed forward for the purpose of increasing packing densities of the semiconductor devices. With the fine structuring of the constituent elements, dimensional variations in processing lead to variations in characteristic from element to element, causing degradation of the performance of semiconductor devices.

For example, in non-volatile semiconductor memories, such as EEPROMs and the like, that have dual-gate (floating gate/control gate) cells, the capacitive coupling ratio between static capacitance C1 associated with a gate insulating layer between the semiconductor substrate and the floating gate electrode and static capacitance C2 associated with an insulating layer between the floating gate electrode and the control gate electrode (hereinafter referred to as the intergate insulating layer), i.e., C2/(C1+C2), varies from cell to cell. This is a serious problem. Hereinafter, the capacitive coupling ratio is referred simply to as the coupling ratio.

With memory devices in which a cell isolating insulating layer is formed by means of LOCOS (localized oxidation of silicon), the shape (area) of the gate insulating layer (tunnel oxide layer) on the substrate surface is determined by a width of cell isolation, while the shape (area) of the intergate insulating layer is determined by the width, thickness or the like of the floating gate electrode. Thus, the shape (area) of the gate insulating layer and the shape (area) of the intergate insulating layer are each determined by a separate factor, increasing variations in coupling ratio from cell to cell.

Even with memory devices in which cell isolation is practiced by buried cell isolation, on the other hand, the shape (area) of the gate insulating layer and the shape (area) of the intergate insulating layer are each determined by a separate factor. Thus, the coupling ratio will vary greatly from cell to cell.

Thus, if the area of the gate insulating layer and the area of the intergate insulating layer vary from cell to cell, the electric field applied to the gate insulating layer varies when a voltage is applied to the control gate electrode. This will cause a tunnel current that flows at writing/erasing time to vary from cell to cell. As a result, the writing/erasing characteristic will vary from cell to cell, causing malfunctions.

To attain further micro-miniaturization of an element, a method has also been proposed which forms a floating gate electrode so as to protrude from the substrate surface and then forms an intergate insulating layer on the protruding surface. That is, a gate insulating layer is first formed on the bottom of a groove lying between cell isolation insulating layers and then the floating gate electrode is formed so as to bury the groove and protrude from the top of the isolation insulating layer. An intergate insulating layer is formed on the exposed portion of the floating gate electrode and the control gate electrode is formed on the intergate insulating layer.

To increase the coupling ratio, the area of the intergate insulating layer could be increased by increasing the sidewall length (the thickness of the portion above the groove) of the floating gate electrode. In this case, however, it would become difficult to control the height of the floating gate electrode (the thickness of the portion within the groove plus the thickness of the portion above the groove) and the length of overlap between the floating gate electrode and the cell isolation insulating layer. This would result in great variations in the sidewall length of the floating gate electrode from cell to cell. In this case as well, variations in the coupling ratio would increase and the writing/erasing characteristic would vary from cell to cell, causing malfunctions.

Further, if the intergate insulating layer were formed for the above-described memory cell structure by using a usual technique, the average thickness of those portions of the insulating layer which border the cell isolation insulating layer would become thinner than the average thickness of the intergate insulating layer, resulting in a further increase in variations in coupling ratio.

The reason why the boundaries of the intergate insulating layer become small in thickness is that it becomes difficult to introduce oxidant or deposition species serving to form the intergate insulating layer into the boundaries between the exposed surface of the floating gate electrode and the surface of the cell isolation insulating layer because the distance between adjacent floating gate electrodes becomes short due to fine grooves. Therefore, the thickness of the boundary portions of the intergate insulating layer becomes smaller remarkably as the sidewall length of the floating gate electrode becomes longer, resulting in a further increase in variations in coupling ratio.

The above-described problems will arise in other semiconductor devices. For example, with a so-called mesa-shaped MOS transistor in which the source/drain regions and the channel region are formed in a convex portion of a substrate, the channel width varies for the same reason as above, which causes the current drive characteristic to vary from transistor to transistor.

With a semiconductor device having so-called buried capacitors in which capacitive elements are formed within grooves formed in the substrate surface, the capacitor area will vary because control of the groove depth is difficult. This results in variations in capacitance from element to element.

SUMMARY OF THE INVENTION

It is an object of the invention to provide a semiconductor device which permits variations in characteristic from element to element due to variations in dimension from element to element to be substantially reduced.

To attain the object a semiconductor device according to a first aspect of the invention comprises: a substrate; a first conductive layer formed on the substrate, the first conductive layer comprising a first layer and a second layer formed on the first layer and having at least one of a convexity and a concavity; a first insulating layer formed on the one of the convexity and the concavity of the first conductive layer; and a second conductive layer formed opposed to the one of the convexity and the concavity with the first insulating layer interposed therebetween to thereby form a capacitive element with the first conductive layer, the first insulating layer having a first region having a first capacitance value per unit area that substantially determines a capacitance value of the capacitive element and a second region having a second capacitance value per unit area that is smaller than the first capacitance value per unit area of the first region, and the second region being formed on the first layer of the first conductive layer which is exposed to the one of the convexity and the concavity.

The first layer may be the substrate.

The second layer is preferably grown by an epitaxial growth technique.

A second insulating layer is preferably buried around the convexity, an edge of a top surface of the second insulating layer is set to be in contact with the first layer of the first conductive layer, and the second region of the first insulating layer is formed above the top surface of the second insulating layer.

Further, a bottom surface of the concavity is preferably set to be inside of the first layer of the first conductive layer.

The thickness of the first region of the insulating layer may be set thinner than the second region to thereby set the capacitance value per unit area of the first region larger than that of the second region.

Alternatively, the dielectric constant of the first region of the first insulating layer may be set larger than that of the second region to thereby set the capacitance value per unit area of the first region larger that of the second region.

In this case, the second layer may contain a main constituent material and at least one impurity material, the latter being selected such that anyone of the dielectric constant of a compound of it and oxygen and the dielectric constant of a compound of it and the main material is larger than that of a compound of the main material and oxygen.

Alternatively, the first layer may contain a main constituent material and at least one impurity material, the latter being selected to be one of fluorine and an element such that anyone of the dielectric constant of a compound of it and oxygen and the dielectric constant of a compound of the main material and the impurity material is larger than that of a compound of the main material and oxygen.

The first conductive layer, the second conductive layer and the first insulating layer may be used as a floating gate electrode, a control gate electrode, and an intergate insulating layer, respectively, of a non-volatile memory cell.

The first conductive layer, the second conductive layer and the first insulating layer may be used as a convex active layer, a gate electrode, and a gate insulating layer, respectively, of a convex MOS transistor.

The first conductive layer, the second conductive layer and the first insulating layer may be used as a first capacitor electrode, a second capacitor electrode, and a capacitor insulating layer, respectively, of a concave capacitor.

According to the first aspect, in a capacitive element comprising two conductive layers which are opposed to each other with an insulating layer interposed therebetween, variations in area of a region having larger capacitance from element to element is determined by variations in dimension of one conductive layer in the direction of thickness. Usually the thickness control of conductive layers by deposition is easy in comparison with the depth control of grooves. Therefore, variations in area of this region can be made smaller than variations in area of the entire opposed surfaces from element to element.

A semiconductor device according to a second aspect of the invention comprises: a substrate; a first conductive layer formed on the substrate; and a plurality of capacitive elements formed with same dimensions in either convexities or concavities formed in the first conductive layer, each of the capacitive elements being formed of the first conductive layer, an insulating layer formed on the first conductive layer, and a second conductive layer formed on the insulating layer to be opposed to the first conductive layer, the insulating layer having a first region having a first area and a first capacitance value per unit area that substantially determines a capacitance value of the capacitive element and a second region having a second area and a second capacitance value per unit area that is smaller than the first capacitance value per unit area, and a variance that the first area has in a population of the plurality of capacitive elements is smaller than a variance that a sum of the first and second areas has in the population of the capacitive elements.

The thickness of the first region of the insulating layer may be set thinner than that of the second region to thereby set the first capacitance value per unit area of the first region larger than the second capacitance value per unit area of the second region.

Alternatively, the dielectric constant of the first region of the insulating layer may be set larger than that of the second region to thereby set the first capacitance value per unit area of the first region larger than the second capacitance value per unit area.

In this case, the first region may contain a main material and at least one impurity material, the latter being such that anyone of the dielectric constant of a compound of the impurity material and oxygen and the dielectric constant of a compound of the main material and the impurity material is larger than that of a compound of the main material and oxygen.

Alternatively, the second region may contain a main material and at least one impurity material, the impurity material being selected to be one of fluorine and an element such that anyone of the dielectric constant of a compound of the impurity material and oxygen and the dielectric constant of a compound of the impurity material and the main material is smaller than that of a compound of the main material and oxygen.

The first conductive layer, the second conductive layer and the first insulating layer may be used as a floating gate electrode, a control gate electrode, and an intergate insulating layer, respectively, of a non-volatile memory cell.

The first conductive layer, the second conductive layer and the first insulating layer may be used as a convex active layer, a gate electrode, and a gate insulating layer, respectively, of a convex MOS transistor.

The first conductive layer, the second conductive layer and the insulating layer may be used as a first capacitor electrode, a second capacitor electrode, and a capacitor insulating layer, respectively, of a concave capacitor.

According to the second aspect, in a capacitive element comprising two conductive layers which are opposed to each other with an insulating layer interposed, there are provided a first and a second region which are large and small, respectively, in capacitance per unit area. Variations in area of the opposed surface of the first region from element to element are made smaller than variations in the area of the entire opposed surface from element to element. Thus, variations in capacitance from element to element can be made smaller than variations in the opposed area of electrodes from element to element.

The above-described variations means variance $\sigma^2$ or standard deviation $\sigma$ and are given by $$\sigma^2 = \sum_{i=1}^{N} \frac{(A_i - \overline{A})^2}{N}$$

where N represents the number of semiconductor elements of the same type included in a semiconductor device, Ai represents the area of a region of interest of the i-th element, and $\overline{A}$ represents the average area of the regions of interest of the respective semiconductor elements.

If N is so large as to make it difficult to measure the area Ai for all the elements, then it may be allowed to extract a number n (<N) of elements randomly and calculate variance $\sigma_n^2$ for their population as $$\sigma^2 = \sum_{i=1}^{n} \frac{(A_i - \overline{A}_n)^2}{n}$$

where $\overline{A}_n$ is the average area in the population having n elements.

In order to correctly estimate the standard deviation for the extracted population, it is important how to select a number n of elements to be extracted. Consider now the probability that the area deviates from the average value by a certain value or more. Suppose that the probability in the N-piece population is P and the probability in the n-piece population is p. Then, provided that N>>n>>1, $$\text{probability} = 68.3\% \text{ for } |p - P| < \sqrt{P(1-P)/n}$$

$$\text{probability} = 95.4\% \text{ for } |p - P| < 2\sqrt{P(1-P)/n}$$

When n=100, the probability that p=0.2±0.04 for P=0.2 is 68.3% and the probability that p=0.2±0.08 is 95.4%.

If, therefore, at least 100 elements are extracted for population, then the area distribution in the population will reflect the whole area distribution almost correctly.

A semiconductor device of a third aspect of the invention comprises: a semiconductor substrate having a major surface; a first insulating layer formed on the major surface of the semiconductor substrate; a first electrode formed on the first insulating layer, the first electrode having a first main surface opposing to the first insulating layer and in a shape of a rectangle having four sides; a second insulating layer formed on the first electrode, the first electrode having a second main surface opposing to the second insulating layer and in a shape of a rectangle having four sides each of which is parallel to a respective one of the four sides of the first main surface, the second main surface being larger than the first main surface in a length of each of at least one pair of opposed sides; and a second electrode formed on the second insulating layer.

A stack of the first electrode, the second insulating layer, and the second electrode preferably includes a pair of opposing side surfaces formed such that a dimension of the stack along a direction perpendicular to a stacking direction increases linearly in the stacking direction.

Further, the second electrode is preferably formed to cover the top surface of the first electrode.

According to the third aspect, in a memory cell having a dual-gate structure, the first insulating layer (gate insulating layer) and the second insulating layer (intergate insulating layer) are made so that their shape/area will not vary according to manufacturing factors, particularly the ratio will become constant. Thus, variations in coupling ratio can be suppressed. In addition, by the use of a reverse tapered structure in which the the second insulating layer is larger in area than the first insulating area, the coupling ratio can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a sectional view of a mesa-shaped (convex) capacitive element for use in explanation of the essential features of the present invention;

FIG. 2 is a sectional view of a buried (concave) capacitive element for use in explanation of the essential features of the present invention;

FIG. 3 is a perspective view of a mesa-shaped MOS transistor according to a first embodiment of the present invention;

FIGS. 4A through 4D are sectional views taken along line 4—4 of FIG. 3 in the order of steps of manufacture of the MOS transistor according to the first embodiment;

FIGS. 5A through 5D are sectional views taken along line 5—5 of FIG. 3 in the order of steps of manufacture of the MOS transistor according to the first embodiment;

FIGS. 6A through 6D are sectional views of a buried capacitive element in the order of steps of manufacture thereof in accordance with a second embodiment of the present invention;

FIG. 7 is a sectional view of a capacitive element according to a modification of the second embodiment;

FIG. 8 is a schematic plan view of the memory cell section of a NAND type of EEPROM according to a third embodiment of the present invention;

FIG. 11 is an enlarged view of the region indicated at XI in FIG. 9C;

FIG. 12 is a graph illustrating a comparison between the present invention and a prior art in variations in threshold voltage due to variations in coupling ratio;

FIGS. 13A and 13B show other examples of methods of controlling the thickness of the insulating layer, FIG. 13A showing an example of introducing changes in dopant density into the floating gate electrode by controlling the range of ion implantation and FIG. 13B showing an example of ion implanting impurities having the oxidation-speed reducing effect into the top of the floating gate electrode diagonally;

FIGS. 14A and 14B illustrate methods of changing the dielectric constant of the intergate insulating layer for the cases where the floating gate electrode is made of a silicon layer and a tantalum-based metal layer, respectively;

FIG. 17 is a graph illustrating a comparison in variations in threshold voltage due to variations in coupling ratio between the EEPROM manufactured in accordance with the method illustrated in FIGS. 15A through 15D and a prior art;

FIGS. 18A through 18D are sectional views illustrating another example of a method of manufacturing an EEPROM in which two insulating layers are made equal in area to each other in the order of steps of manufacture thereof and correspond to sectional views taken along line 9—9 of FIG. 8;

FIGS. 19A through 19D are sectional views corresponding in step of manufacture to FIGS. 15A through 15D, respectively, and correspond to sectional views taken along line 10—10 of FIG. 8;

FIG. 26 is an enlarged view of a region indicated at 26 in FIG. 24D; and

FIGS. 27A and 27B illustrate modifications of the step of FIG. 24C.

DETAILED DESCRIPTION OF THE PREFERRED EMBODIMENTS

Figure 9A:
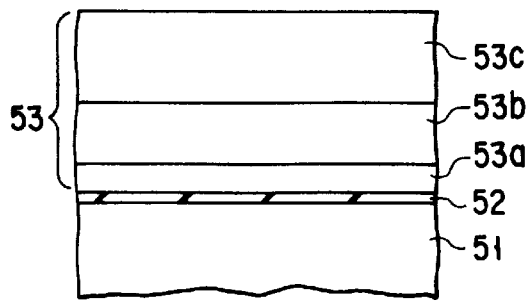
FIGS. 9A through 9D are sectional views, taken along line 9—9 of FIG. 8, of the EEPROM according to the third embodiment in the order of steps of manufacture thereof.

Before describing the preferred embodiments, the essential features of the invention will be described with reference to the drawings.

FIG. 1 is a schematic sectional view of a mesa-shaped (convex) capacitive element formed in a part of a semiconductor device. In an insulating layer 14 formed on a substrate not shown an opening 15 is formed. A first electrode 11 is formed in the opening 15 to project from the insulating layer 14. The electrode 11 and the insulating layer 14 are covered with a second electrode 12 with insulating layers 13a and 13b formed on the first electrode 11 as shown. In this case, the electrode 11 may be formed by processing the substrate. The insulating layer 13a is formed relatively thin, making its associated capacitance (first capacitance) between the first and second electrodes relatively large. On the other hand, the insulating layer 13b is formed relatively thick, making its associated capacitance (second capacitance) between the first and second electrodes relatively small. The overall capacitance of the capacitive element constructed from the first and second electrodes 11 and 12 and the insulating layers 13a and 13b will depend mainly on the first capacitance.

As shown in FIG. 1, $d_1$ is a height of an electrode portion which is covered with the thin insulating layer 13a, and $d_2$ is a height of an electrode portion which is covered with the thick insulating layer 13b. If the dimensional precision for $d_1$ is better than that for $d_2$, then variations in the first capacitance value in manufacture will be reduced. This will also suppress variations in the overall capacitance value in manufacture.

FIG. 2 is a schematic sectional view of a buried (concave) capacitive element formed in a part of a semiconductor device. An opening 20a is formed in an insulating layer 24 formed on one surface of a substrate 21, which is formed with a trench 20b that communicates with the opening 20a. Insulating layers 23a and 23b are formed on the inner surface of the trench 20b. The insulating layer 23a is formed relatively thin, making its associated capacitance (first capacitance) between a first electrode 22 and the substrate 21 serving as a second electrode relatively large. On the other hand, the insulating layer 23b is made relatively thick, making its associated capacitance (second capacitance) relatively small. Thus, the overall capacitance of the capacitive element constructed from the first and second electrodes 21 and 22 and the insulating layers 23a and 23b is determined mainly by the first capacitance value.

In the capacitive element of FIG. 2, $d_3$ is a depth of an electrode portion which is covered with the thin insulating layer 23a, and $d_4$ is a depth of an electrode portion which is covered with the thick insulating layer 23b. If the dimensional precision for $d_3$ is better than that for $d_4$, then variations in the first capacitance value in manufacture will be reduced. This will also suppress variations in the overall capacitance value in manufacture.

The present invention is based on the above-described principles and specific embodiments will be described below.

(First Embodiment)

FIG. 3 is a perspective view of a mesa-shaped MOS transistor according to a first embodiment of the invention. A method of manufacture thereof is illustrated in FIGS. 4A through 4D and FIGS. 5A through 5D. FIGS. 4A through 4D and FIGS. 5A through 5D are sectional views taken along line 4—4 and line 5—5, respectively, of FIG. 3.

First, as shown in FIGS. 4A and 5A, a heavily doped silicon layer 31b, which is doped with boron at a concentration of $1 \times 10^{20}$ cm$^{-3}$, is grown over a major surface of a p-type silicon substrate 31a (e.g., resistivity=10 Ωcm, crystal plane=(100)), by means of vapor phase epitaxy, to a thickness of 100 nm. Then, a lightly doped silicon layer 31c of a boron concentration of $1 \times 10^{17}$ cm$^{-3}$ and a thickness of 100 nm is grown over the silicon layer 31b by using vapor phase epitaxy.

Next, the silicon layers 31c and 31b and the silicon substrate 31a are etched in sequence by RIE (reactive ion etching) to form a device isolation trench of a depth of 300 nm. Then, a silicon oxide 32 is deposited by CVD (chemical vapor deposition) to be embedded in the trench. The oxide overflowing the trench is removed by chemical and mechanical polishing until it becomes flush with the silicon layer 31c. The silicon oxide 32 within the trench is etched away by RIE until it adjoins to the sidewall of the highly-doped silicon layer 31b (see FIGS. 4B and 5B).

Next, a silicon oxide 33 serving as a gate oxide is formed by thermal oxidation. At this point, the thickness of the silicon oxide 33 was 8 nm on the surface of the heavily-doped silicon layer 31b and 6 nm on the surface of the lightly-doped silicon layer 31c, for the oxidation speed varies according to a difference in the concentration of boron between silicon layers. After that, a polycrystalline silicon layer 34 serving as a gate electrode is deposited, by CVD, at a thickness of 150 nm and then doped with phosphorus at a concentration of $3 \times 10^{20}$ cm$^{-3}$ (FIGS. 4C and 5C).

After that, the polycrystalline silicon layer 34 is etched by RIE to form a gate electrode. Finally, by using the polycrystalline silicon layer 34 as a mask, arsenic ions are implanted to form n-type diffused regions 35 serving as the source and drain using a self-aligned process, thereby completing a mesa-shaped MOS transistor (FIGS. 4D and 5D).

According to the present embodiment, the effective channel region is defined by a thin layer of oxide 33 formed along the silicon layer 31c. Variations in characteristics from transistor to transistor depend mainly on variations in the thickness of the silicon layer 31c. Since the silicon layer 31c is formed by epitaxial growth, its variations in thickness are relatively small. The total area of a thick region of the silicon oxide 33 depends mainly on the precision of etching depth of the silicon layers 31c, 31b and 31a by RIE and the precision of etch back depth of the silicon oxide film 32 by RIE, and thus its variations are relatively large. However, since the thick region of the oxide 33 does not much contribute to the formation of the channel region, it has little effect on variations in characteristics from transistor to transistor. In this way, it becomes possible to fabricate transistor elements with reduced variations in characteristics from transistor to transistor.

(Second Embodiment)

FIGS. 6A through 6D are sectional views of a buried MOS capacitor according to a second embodiment of the invention in the order of steps of manufacture.

First, as shown in FIG. 6A, on the surface of a phosphorus-doped region 41a which is formed on a silicon substrate and highly doped with phosphorus at a concentration of $1 \times 10^{20}$ cm$^{-3}$ a phosphorus-doped silicon layer 41b doped with phosphorus at a concentration of $1 \times 10^{17}$ cm$^{-3}$ is grown by vapor phase epitaxy to a thickness of 100 nm. Then, a silicon oxide layer 42 is deposited by CVD to a thickness of 100 nm.

Next, the silicon oxide 42 and the silicon layers 41b and 41a are etched in sequence by RIE to create a capacitor-forming trench of a depth of 250 nm (FIG. 6B).

Next, a silicon oxide 44 serving as a capacitor dielectric layer is formed by thermal oxidation. At this point, the thickness of the silicon dioxide is 8 nm on the surface of the heavily-doped silicon layer 41a and 6 nm on the surface of lightly-doped silicon layer 41b because the oxidation speed varies according to a difference in phosphorous concentration between silicon layers (FIG. 6C).

After that, a polycrystalline silicon layer 45 forming a capacitor electrode is deposited by CVD at a thickness of 150 nm and then doped with phosphorus at a concentration of $3 \times 10^{20}$ cm$^{-3}$. Thus, a buried MOS capacitive element is completed.

FIG. 7 shows a modification of the present embodiment. In this example, two trenches 44a and 44b are formed in the phosphorus-doped silicon layers 41a and 41b. These trenches share a capacitor electrode to form one capacitor. In this case as well, variations in overall capacitance value depend mainly on variations in capacitance associated with the silicon layer 41b.

In the present embodiment, the oxide on the bottom of the trench which forms a main source of variations in capacitance value is formed thick and the thin insulating layer is formed on the trench sidewall easy to obtain high dimensional precision, allowing MOS capacitive elements with no great variations in capacitance value to be realized.

Other advantages of the first and second embodiments include an improvement in dielectric strength by increasing the thickness of an insulating layer formed in the vicinity of the boundary with the device isolation insulating layer or on the bottom of the trench in the substrate and an improvement in charge holding characteristic.

(Third Embodiment)

FIGS. 8 through 11 illustrate a method of manufacturing a NAND type of EEPROM memory cells according to a third embodiment of the invention. FIG. 8 is a schematic plan view of a portion of the NAND type of EEPROM. In FIG. 8, CG (56) denotes control lines, BL denotes bit lines which are shown dotted, and MC denotes memory cell forming regions which are shown hatched. FIGS. 9A through 9D illustrate a method of manufacturing a memory cell according to this embodiment in the order of steps of manufacture and correspond to sectional views taken along line 9—9 of FIG. 8. FIGS. 10A through 10D are sectional views taken along line 10—10 of FIG. 8, which correspond in step of manufacture to FIGS. 9A through 9D, respectively. Note that the bit lines BL are not formed in steps of FIGS. 9A through 9D (FIGS. 10A through 10D). FIG. 11 is an enlarged view of the region indicated by XI in FIG. 9C.

Figure 10A:
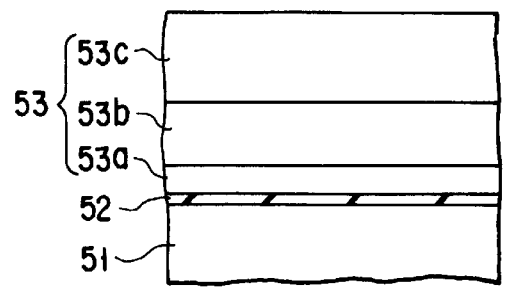
FIGS. 10A through 10D are sectional views taken along the line 10—10 of FIG. 8 and correspond in step of manufacture to FIGS. 9A through 9D, respectively.

First, as shown in FIGS. 9A and 10A, over a major surface of a p-type silicon substrate 51 (resistivity=10 Ωcm, crystal plane=(100)) a silicon oxide 52, which serves as a gate insulating layer (tunnel oxide layer), is formed by thermal oxidation to a thickness of, say, 10 nm. After that, a phosphorus-doped polycrystalline silicon layer of multilayer structure, serving as a floating gate electrode, is deposited by CVD over the gate insulating layer 52. The silicon layer 53 is formed as follows.

First, a first phosphorus-doped polycrystalline silicon layer 53a doped with phosphorus at a concentration of $1 \times 10^{20}$ cm$^{-3}$ is deposited in CVD room to a thickness of 100 nm and then an oxidizing gas at low partial pressure is introduced into the CVD room to form a native oxide layer of an average thickness of 1 nm or less over the surface of the first silicon layer 53a.

Next, a second phosphorus-doped polycrystalline silicon layer 53b doped with phosphorus at a concentration of $3 \times 10^{20}$ cm$^{-3}$ is deposited over the first silicon layer 53a to a thickness of 200 nm and then an oxidizing gas at low partial pressure is introduced to form a native oxide layer of an average thickness of 1 nm or less over the surface of the second silicon layer 53b.

Finally, a third phosphorus-doped polycrystalline silicon layer 53c doped with phosphorus at a concentration of $1 \times 10^{20}$ cm$^{-3}$ is deposited over the second silicon layer 53b to a thickness of 300 nm, thereby completing the formation of the phosphorus-doped polycrystalline silicon layer 53 of three-layer structure.

If the processing temperature, for example a temperature for deposition, oxidation, and the like, is lowered, the above-mentioned native oxide is not necessarily provided, because impurity diffusion to an adjacent layer is lessened.

Figure 9B:
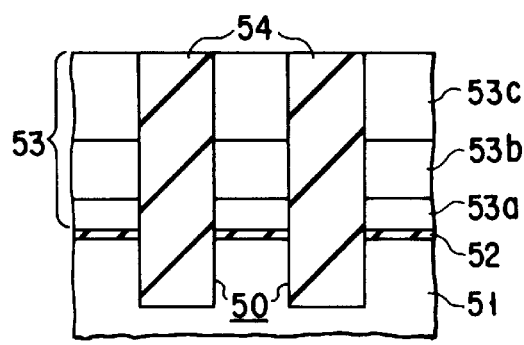
Figure 10B:
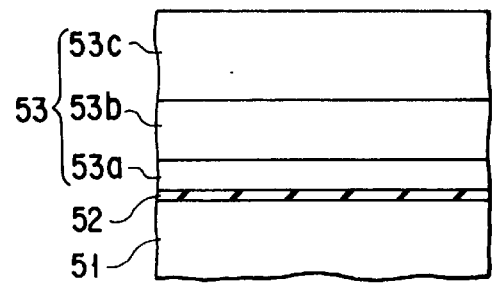

Next, as shown in FIGS. 9B and 10B, the polycrystalline silicon layer 53, the gate insulating layer 52 and the silicon substrate 51 are sequentially subjected to reactive ion etching to form cell isolation trenches 50 of a depth of 900 nm.

Next, a cell isolation insulating layer 54 of silicon oxide is deposited by CVD over the entire surface. After the trenches 50 are filled with this insulating layer, the insulating layer that overflowed the trenches 50 are polished by chemical and mechanical polishing until the surface of the polycrystalline silicon layer 53 is reached to thereby flatten the substrate surface.

Figure 9C:
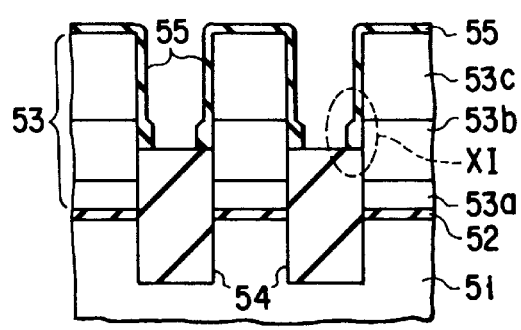
Figure 10C:
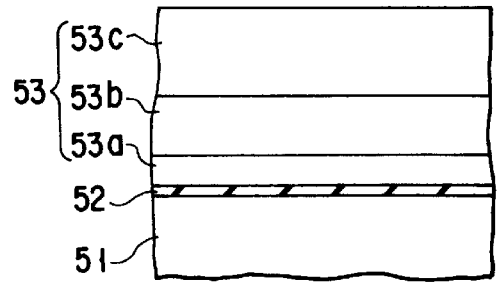

Next, as shown in FIGS. 9C and 10C, the insulating layer 54 within the trenches 50 are etched using reactive ion etching and the etching process is stopped at a point where the insulating layer surface is brought in contact with the sidewall of the second silicon layer 53b. That is, the trenches are filled in with the insulating layer 54 at a depth below the surface of the silicon layer 53b.

Then, as shown in FIGS. 9C and 10C, the exposed surface of the silicon layer 53 is subjected to thermal oxidation, whereby a first thin layer 55b of silicon oxide is formed over the exposed surface. In this case, the oxidation speed varies according to the distribution of phosphorus concentration within the silicon layer 53. Thus, as shown in FIG. 11, the thickness of the first silicon oxide layer 55 becomes 8 nm on the surface of the third silicon layer 53c and 12 nm on the surface of the second silicon layer 53b. That is, in the vicinity of the insulating layer 54 the average thickness of that silicon oxide layer 55b becomes larger than that in other portions.

Next, as shown in FIG. 11, a layer 55c of silicon nitride of a thickness of 8 nm is formed by CVD over the surface of the silicon oxide layer 55b and then the surface of the silicon nitride layer 55c is thermally oxidized to form a second thin layer 55d of silicon oxide to a thickness of 5 nm. In this manner an intergate insulating layer 55 of three-layer structure is completed which has a thick portion in the vicinity of the device isolation insulating layer 54. In this case, variations in the area of the thin portion of the intergate insulating layer 55 from cell to cell are determined by variations in the thickness of the third silicon layer 53c from cell to cell.

Figure 9D:
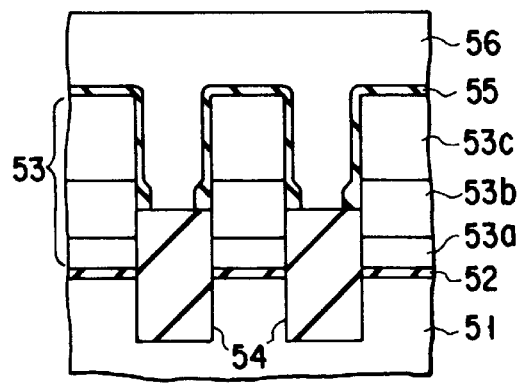
Figure 10D:
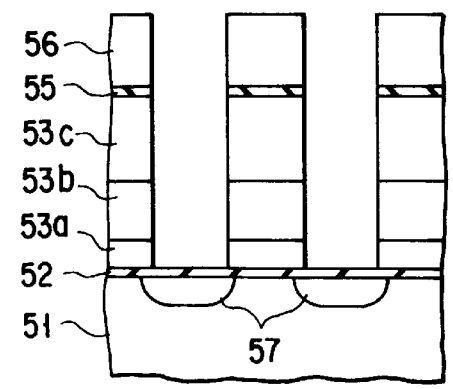

Next, as shown in FIGS. 9D and 10D, a thick layer of polycrystalline silicon of a thickness of the order of 300 nm, serving as a control gate electrode 56, is formed over the entire surface. After its surface is flattened, the silicon layer is doped with phosphorus at a concentration of about $3 \times 10^{20}$ cm$^{-3}$.

Next, the silicon layer 56, the intergate insulating layer 55 and the silicon layer 53 are etched in sequence by reactive ion etching to define the gate electrode 56, the intergate insulating layer 55, and the floating gate electrode 53.

Finally, by using the control gate electrode 56 as a mask, arsenic ions are implanted into the silicon substrate 51 to form n-type diffused regions 57 that self-align to the gate, whereby EEPROM memory cells are completed.

FIG. 12 shows variations in threshold voltage of memory cells fabricated in accordance with the method of the present embodiment by which a dopant concentration distribution is introduced into the floating gate electrode and a conventional method by which no such distribution is introduced. Variations in threshold voltage result from variations in coupling ratio. It will be understood from this figure that the present invention allows variations in coupling ratio and hence variations in threshold voltage to be substantially reduced.

The method of introducing a dopant concentration distribution in the floating gate electrode is not limited to the use of three layers of phosphorus-doped polycrystalline silicon. Instead, various layers or various multilayer structures may be used. Besides making the floating gate electrode multilayered, a method may be used which, as shown in FIG. 13A, first deposits a phosphorus-doped polycrystalline silicon layer 53 and then implants phosphorus ions into that layer while controlling the implantation range of ion species. By this method a heavily-doped region 53b can be formed.

The method of changing the thickness of the intergate insulating layer is not limited to the above-described concentration distribution control of dopant impurities such as phosphorus, arsenic, boron, etc. Instead use may be made of impurities that modulate the oxidation speed of the floating gate electrode. For example, impurities having the oxidation speed increasing effect, such as fluorine, chlorine, etc., may be introduced into the second polycrystalline silicon layer 53b. Alternatively, as shown in FIG. 13B, impurities having the oxidation speed reducing effect, such as nitrogen, aluminum, etc., may be introduced into the third polycrystalline silicon layer 53c by diagonal ion implantation.

Further, the method of changing the capacitance associated with the intergate insulating layer is not limited to the thickness control of that layer. Instead the dielectric constant of the intergate insulating layer may be controlled. It is known that the dielectric constant of silicon oxide doped with fluorine decreases due to its polarization effect. When the second layer 53b of the multilayered polycrystalline silicon layer is doped with fluorine, therefore, the dielectric constant of that part of the thermally grown layer 55b (shown in FIG. 11) which is formed on the surface of the second layer becomes smaller than that of its other part, helping reduce variations in coupling ratio. Alternatively, an element that, when chemically combined with oxide or silicon, exhibits smaller dielectric constant than silicon oxide may be introduced into the silicon layer 53b.

In contrast with the above example, when an element, such as tantalum (Ta), hafnium (Hf), zirconium (Zr), lead (Pb), titanium (Ti), or the like, which, when combined with oxygen, exhibits a larger dielectric constant than silicon oxide is introduced into the third layer 53c of the multilayered polycrystalline silicon layer 53, the dielectric constant of the thermally grown layer 55b formed on that layer becomes large. In this case as well, variations in coupling ratio are reduced.

Moreover, as shown in FIG. 14A, the top layer 53c of the floating gate electrode 53 may be doped with nitrogen whose silicon compound has a greater dielectric constant than silicon oxide and then subjected to thermal oxidation. In this case, the surface of the upper layer 53c becomes a silicon dioxide (SiO$_2$) layer 55e containing nitrogen and the surface of the lower layer becomes a silicon dioxide layer 55a. As a result, the upper insulating layer becomes higher in dielectric constant than the lower insulating layer.

Furthermore, as shown in FIG. 14B, when a floating gate electrode 153 is used which is made of tantalum-based metal, the floating gate electrode may be formed such that its lower portion 153b is made of TaSi$_x$ and its upper portion 153c is made of tantalum and then subjected to thermal oxidation. In this case, the surface of the upper portion 153c will become a layer 155b of Ta$_2$O$_5$ and the surface of the lower portion 153b will become a SiO$_2$ layer 155a containing tantalum. Thus, the upper insulating layer will become higher in dielectric constant than the lower insulating layer.

In addition, although, in the present embodiment, thermal oxidation is used to form the first layer of silicon oxide over the floating gate electrode 53, CVD may be used instead. In this case, a portion of the intergate insulating layer in the vicinity of the isolation insulating layer can be made thicker than the average thickness of the other portion using a difference in thickness of native oxide layers formed within a CVD chamber. Besides, impurities that modulate the so-called incubation time, which is the time before the insulating layer deposition is started, may be previously introduced into the floating gate electrode 53 with concentration distribution in the direction of its thickness.

The methods of forming the tunnel (gate) oxide, the floating gate electrode, the intergate insulating layer, the control gate electrode, and the element isolation insulating layer, which are described in connection with the embodiment, are only illustrative and not restrictive. For example, although, in the present embodiment, the etching step to form the control gate electrode pattern is followed by the etching step to form the side surfaces of the floating gate electrode for the following intergate insulating layer forming step and to define the channel width, it is also possible to form the intergate insulating layer after the latter etching step and then carry out layer-forming and etching steps to form the control gate electrode.

In the first, second and third embodiments described above, variations in capacitance from cell to cell are reduced by keeping the shape and area of insulating layers for determining a capacitance value constant. Where a characteristic value is determined by the ratio between two capacitance values as in the case of the coupling ratio of the EEPROM, variations in characteristic from cell to cell can be reduced by taking a construction such that the ratio between capacitance values will not vary from cell to cell. Such a construction will be described next.

FIGS. 15A through 15D and FIGS. 16A through 16D are sectional views illustrating an example (Example 1) of a method of manufacturing a NAND type of EEPROM. FIGS. 15A through 15D and FIGS. 16A through 16D correspond to sectional views taken along line 9—9 and line 10—10, respectively, of FIG. 8.

Figure 15A:
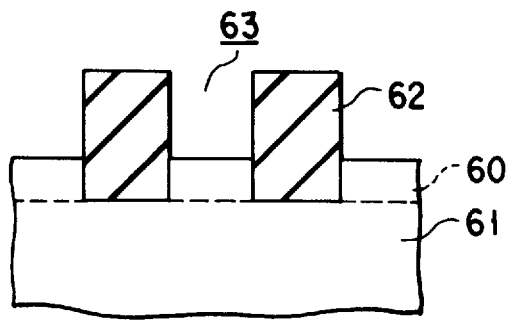
FIGS. 15A through 15D are sectional views illustrating an example of a method of manufacturing an EEPROM, in which two insulating layers become equal in area to each other, in the order of steps of manufacture thereof and correspond to sectional views taken along line 9—9 of FIG. 8.
Figure 16A:
FIGS. 16A through 16D are sectional views corresponding in step of manufacture to FIGS. 15A through 15D, respectively, and correspond to sectional views taken along line 10—10 of FIG. 8.

First, as shown in FIGS. 15A and 16A, a thick layer of silicon oxide of a thickness of the order of 300 nm is formed by thermal oxidation over the entire surface of a p-type silicon substrate (for example, resistivity=10 Ωcm, crystal plane=(100)) 61. The resultant thick layer serves as an element isolation insulating layer 62.

Next, the silicon oxide layer 62 is subjected to anisotropic etching such as reactive ion etching to form a trench 63, used as a cell forming region, which has vertical sidewalls reaching the silicon substrate 61 and a cell isolation insulating layer 62. After that, on the bottom of the trench 63 a silicon layer 60 is grown by means of vapor phase epitaxy, which serves as a cell forming layer. The vapor phase epitaxial growth step eliminates damage to the silicon substrate 61 caused by the anisotropic etching at the time of formation of the trench 63. In this example, the silicon layer 60 and the silicon substrate 61 are referred collectively to as the silicon substrate 61.

Figure 15B:
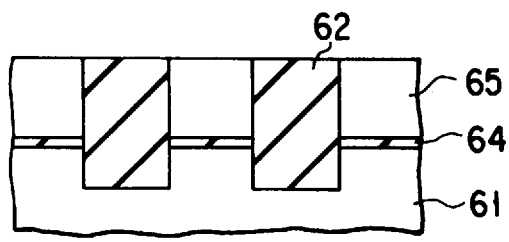
Figure 16B:
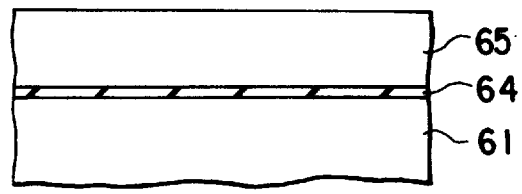

Next, as shown in FIGS. 15B and 16B, the surface of the silicon substrate 61 is subjected to thermal oxidation to form a thin layer of silicon oxide of a thickness of the order of 10 nm, which serves as a gate insulating layer (tunnel oxide layer) 64.

Next, a polycrystalline silicon layer 65 of a thickness of the order of 200 nm is formed by means of CVD, which serves as a floating gate electrode. The silicon layer 65 is doped with phosphorus at a concentration of, say, $1 \times 10^{20}$ cm$^{-3}$ and then polished by chemical and mechanical polishing using the isolation insulating layer 62 as a stopper, so that its surface is flattened. As a result, the dimensions of the exposed surface of the silicon layer 65 are made identical to those of the gate insulating layer 64 using a self-aligned process.

Figure 15C:
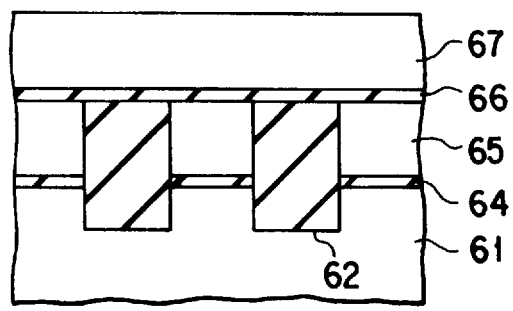
Figure 16C:
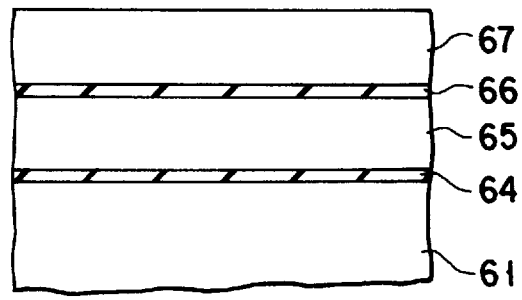

Next, as shown in FIGS. 15C and 16C, a multilayer insulating layer 66 is formed over the entire surface, which serves as a intergate insulating layer. That is, a first thin layer of silicon oxide of a thickness of the order of 6 nm is first formed by thermal oxidation and then a thin layer of silicon nitride of a thickness of the order of 12 nm is formed by CVD over the first layer of silicon oxide. After that, the surface of the silicon nitride layer is oxidized by thermal oxidation to form a second thin layer of silicon oxide at a thickness of the order of 5 nm. As a result, the first layer of silicon oxide, the thin layer of silicon nitride, and the second thin layer of silicon oxide are stacked in sequence to form the multilayer insulating layer 66.

Next, a silicon layer 67 of a thickness of the order of 300 nm is formed by CVD over the entire surface, which serves as a control gate electrode. The silicon layer 67 is then doped with phosphorus at a concentration of, say, $3 \times 10^{20}$ cm$^{-3}$.

Figure 15D:
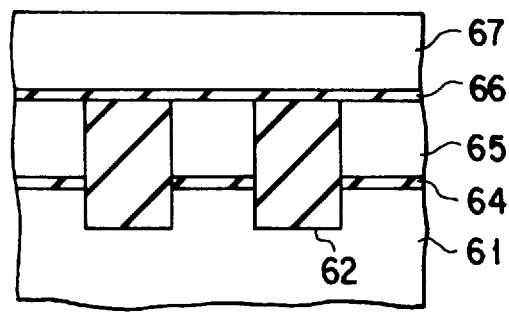
Figure 16D:
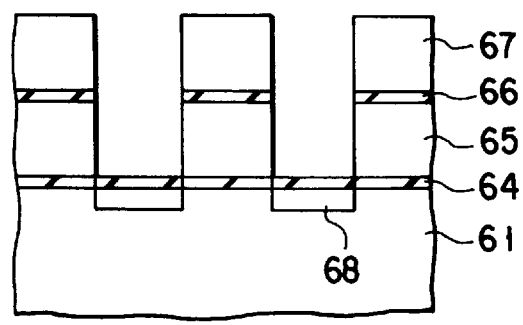

Next, as shown in FIGS. 15D and 16D, by using the same mask, the silicon layer 67, the insulating layer 66 and the silicon layer 65 are etched in sequence by means of anisotropic etching such as reactive ion etching, thereby forming the control gate electrode 67, the intergate insulating layer 66, and the floating gate electrode 65.

At this point, the effective area of the intergate insulating layer 66 is defined to self-align to the gate insulating layer. Thus, that portion of the gate insulating layer 64 which is opposed to the floating gate electrode 65 and that portion of the intergate insulating layer 66 which is opposed to the floating gate electrode 65 become equal to each other in shape and area.

Finally, by using the control gate electrode 67 as a mask, n-type impurities are ion implanted into the silicon substrate 61. Thus, n-type diffused regions 68 are formed using a self-aligned process, thereby completing an EEPROM memory cell.

FIG. 17 shows a comparison between variations in threshold voltage resulting from variations in the coupling ratio of memory cells fabricated in accordance with the method described in connection with the present example (Example 1) and those of conventional memory cells fabricated using LOCOS device isolation. It will be understood from this figure that, with this example, variations in coupling ratio are substantially reduced. According to this example, therefore, an increase in variations in writing/erasing characteristic from cell to cell due to the progress of fine patterning of memory cells can be checked to avoid malfunctions.

The reason why variations in coupling ratio from cell to cell are small in this example is that, since the gate insulating layer 64 and the intergate insulating layer 66 are formed using a self-aligned process, the ratio of the area of that portion of the gate insulating layer which is opposed to the floating gate electrode 65 and the area of that portion of the intergate insulating layer which is opposed to the floating gate electrode varies little from cell to cell.

The shape of those portions of the gate insulating layer 64 and the intergate insulating layer 66 which are opposed to the floating gate electrode 65 is determined by the anisotropic etching step to form the device isolation insulating layer of FIGS. 15A and 16A and the anisotropic etching step to form the control gate electrode of FIGS. 15D and 16D using a self-aligned process.

According to this example, not only the gate insulating layer 64 and the intergate insulating layer 66 but also the control gate electrode 67 and the floating gate electrode 65 are formed using a self-aligned process, thus allowing memory cells to be formed in the minimum dimensions in lithography.

Although, in the above example, the intergate insulating layer 66 is formed over the entire flattened surface, it may be selectively formed only on the exposed surface of the polycrystalline silicon layer 65. The gate insulating layer 64, the floating gate electrode 65 and the intergate insulating layer 66 need not always be formed after the element isolation insulating layer 62 has been formed, for it is necessary only that the gate insulating layer 64, the floating gate electrode 65 and the intergate insulating layer 66 be eventually formed within the element forming region defined by the element isolation insulating layer 62. Next, such a modification (Example 2) will be described.

FIGS. 18A through 18D and FIGS. 19A through 19D are sectional views illustrating another example (Example 2) of a method of manufacturing a NAND type of EEPROM. FIGS. 18A through 18D and FIGS. 19A through 19D correspond to sectional views taken along line 9—9 and line 10—10, respectively, of FIG. 8.

The feature of this example is that an element isolation insulating layer is formed after a gate insulating layer and a floating gate electrode have been formed. First, as shown in FIGS. 18A and 19A, the entire surface of a p-type silicon substrate 71 (for example, resistivity=Ωcm, crystal plane= (100)) is subjected to thermal oxidation to form a layer of silicon oxide of a thickness of, say, 10 nm serving as a gate insulating layer (tunnel oxide) 72.

Next, a polycrystalline silicon layer 73 of a thickness of, say, 300 nm is formed by CVD over the surface of the gate insulating layer 72 and then doped with phosphorus at a concentration of the order of $1 \times 10^{20}$ cm$^{-3}$. The silicon layer 73 serves as a floating gate electrode.

Next, by using reactive ion etching, the silicon layer 73, the silicon oxide 72 and the semiconductor substrate 71 are sequentially etched in the same mask shape to form an element isolation trench 74 having vertical sidewalls.

In this case, the same mask may be used for sequential etching. Alternatively, the silicon layer 73 may first be etched using a mask and then the silicon oxide 72 and the semiconductor substrate 71 may sequentially be etched with the mask removed.

Next, as shown in FIGS. 18B and 19B, a thick layer of silicon oxide of a thickness of the order of 400 nm is formed by CVD over the entire surface and then etched by using chemical and mechanical polishing until the surface of the silicon layer 73 is reached, thereby forming an element isolation insulating layer 75 having its surface flattened.

Next, as shown in FIGS. 18C and 19C, a multilayer insulating layer 76 serving as an intergate insulating layer is formed over the entire surface. That is, first, a first thin layer of silicon oxide of a thickness of the order of 8 nm is formed by thermal oxidation. Then, a thin layer of silicon nitride of a thickness of the order of 10 nm is formed by CVD over the first layer of silicon oxide. Finally, a second thin layer of silicon oxide of a thickness of the order of 5 nm is formed by thermally oxidizing the top surface of the silicon nitride layer. Thus, the multilayered insulating layer 76 is formed which consists of a stack of the first thin layer of silicon oxide, the thin layer of silicon nitride, and the second thin layer of silicon oxide.

Next, a polycrystalline silicon layer, serving as a control gate electrode 77, is formed over the surface of the multilayered insulating layer 76 to a thickness of the order of 300 nm and then doped with phosphorus at a concentration of the order of $3 \times 10^{20}$ cm$^{-3}$. Next, by using anisotropic etching such as reactive ion etching, the polycrystalline silicon layer 77, the multilayered insulating layer 76 and the polycrystalline silicon layer 73 are sequentially etched vertically with respect to the silicon substrate 71 in the same mask shape, thereby forming the control gate electrode 77, the intergate insulating layer 76, and the floating gate electrode 73.

In this case, the same mask may be used for sequential etching. Alternatively, after the control gate electrode 77 has been etched using a mask, the intergate insulating layer 76 and the floating gate electrode 73 may sequentially be etched using the control gate electrode as a mask. In this case, the etching can be carried out easily by making the control gate electrode 77 and the floating gate electrode 73 of different materials. For example, if the control gate electrode 77 is made by stacking a polycrystalline silicon layer, a tungsten silicide layer, and a tungsten layer in this order from bottom to top, then the polycrystalline silicon layer 73 serving as the floating gate electrode can be etched using the tungsten layer as a mask. This structure can be obtained easily by forming the tungsten layer on the polycrystalline silicon layer and causing silicide formation reaction by annealing.

Finally, as shown in FIGS. 18D and 19D, n-type diffused regions 78 are formed in accordance with a self-aligned process by ion implanting n-type impurities into the substrate using the control gate electrode 77 as a mask, thus completing an EEPROM memory cell.

This example also provides the same advantages as the previous example (Example 1) because the gate insulating layer 72 and the intergate insulating layer 76 are formed using a self-aligned process.

With the gate insulating layer and the intergate insulating layer being of the same shape (same area), in order to perform cell operation, it is required to use insulating layers with different insulating properties for the gate insulating layer and the intergate insulating layer. Although, in this example, silicon oxide is used for the gate insulating layer 72 and an ONO (Oxide, Nitride, Oxide) layer is used for the intergate insulating layer 76, this combination is only illustrative and not restrictive. For example, even when silicon oxide is used for both the gate insulating layer 72 and the intergate insulating layer 76, a silicon oxide layer (intergate insulating layer) formed on the floating gate electrode of polycrystalline silicon and a silicon oxide layer (gate insulating layer) formed on the substrate of single-crystalline silicon have different insulating properties. Thus, the cell operation is allowed.

In the above examples, silicon oxide is used for the gate insulating layer, but another insulating material may be used. What is essential is that, even when an electric field across the gate insulating layer and an electric field across the intergate insulating layer which are produced when a voltage is impressed to the control gate electrode, are equal to each other, charges flowing into the floating gate electrode through the gate insulating layer and charges flowing into the control gate electrode through the intergate insulating layer are made different in their amount.

In the above examples, the gate insulating layer and the intergate insulating layer are of the same shape. Memory cells can be constructed so that the gate insulating layer and the intergate insulating layer have different shapes and the ratio between two capacitances each formed by sandwiching a respective one of the insulating layers between electrodes will not vary from cell to cell. Such an embodiment will be described next.

(Fourth Embodiment)

FIGS. 20A through 20D and FIGS. 21A through 21D are sectional views illustrating a method of manufacturing memory cells of a NAND type of EEPROM according to a fourth embodiment of the invention. FIGS. 20A through 20D and FIGS. 21A through 21D correspond to sectional views taken along line 9—9 and line 10—10, respectively, of FIG. 8.

Figure 20A:
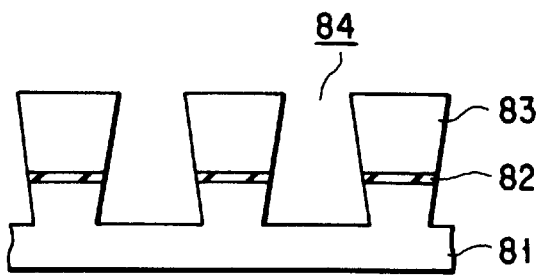
FIGS. 20A through 20D are sectional views illustrating a method of manufacturing a NAND type of EEPROM according to a fourth embodiment of the present invention in the order of steps of manufacture thereof and correspond to sectional views taken along line 9—9 of FIG. 8.
Figure 21A:
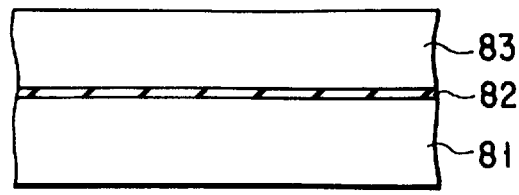
FIGS. 21A through 21D are sectional views corresponding in step of manufacture to FIGS. 20A through 20D, respectively, and correspond to sectional views taken along line 10—10 of FIG. 8.

First, as shown in FIGS. 20A and 21A, a layer of silicon oxide of a thickness of 10 nm is formed by thermal oxidation over the entire surface of a p-type silicon substrate (for example, resistivity=10 Ωcm, crystal plane=(100)) 81. The resultant layer serves as a gate insulating layer (tunnel oxide) 82.

Next, a polycrystalline silicon layer 83 of a thickness of, say, 300 nm, serving as a floating gate electrode, is formed by CVD over the surface of the gate insulating layer 82 and then doped with phosphorus at a concentration of the order of $1 \times 10^{20}$ cm$^{-3}$. By using reactive ion etching, the silicon layer 83, the gate insulating layer 82 and the semiconductor substrate 81 are sequentially etched in the same mask shape to form an element isolation trench 84.

At this point, the etching is carried out so that the area of the gate insulating layer 82 becomes smaller than the area of the top surface of the silicon layer 83. That is, the trench 84 is formed into a reverse tapered form under conditions of a sulfur hexafluoride flow rate of 50 sccm, a pressure of 10 mTorr and a power of 0.9 W/cm$^2$.

Figure 20B:
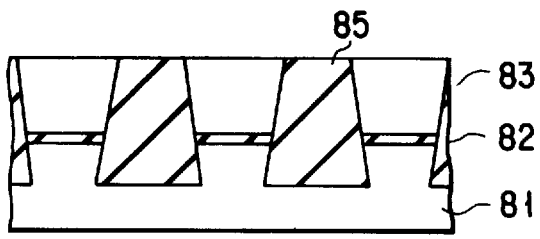
Figure 21B:
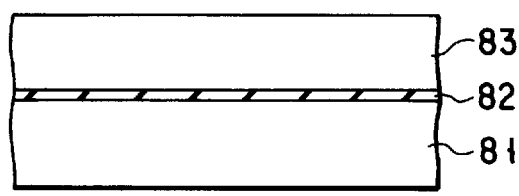

Next, as shown in FIGS. 20B and 21B, a thick layer of silicon oxide of a thickness of the order of 400 nm is formed by CVD over the entire surface and then etched by chemical and mechanical polishing until the surface of the silicon layer 83 is reached, thereby forming an element isolation insulating layer 85 within the trench 84.

Figure 20C:
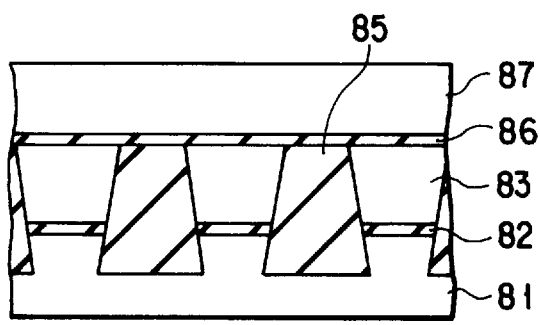
Figure 21C:
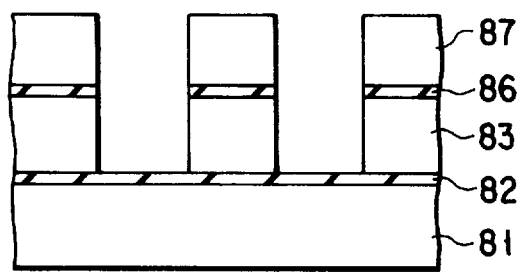

Next, as shown in FIGS. 20C and 21C, a thin layer of silicon oxide of a thickness of, say, 12 nm which serves as an intergate insulating layer 86 and a layer of polycrystalline silicon of a thickness of, say, 300 nm which serves as a control gate electrode 87 are sequentially formed over the entire surface. The polycrystalline silicon layer 87 is then doped with phosphorus at a concentration of, say, $3 \times 10^{20}$ cm$^{-3}$.

Next, the polycrystalline silicon layer 87, the thin layer 86 of silicon oxide and the polycrystalline silicon layer 83 are sequentially etched by reactive ion etching vertically with respect to the surface of the substrate 81, thereby forming the control gate electrode 87, the intergate insulating layer 86, and the floating gate electrode 83.

Figure 20D:
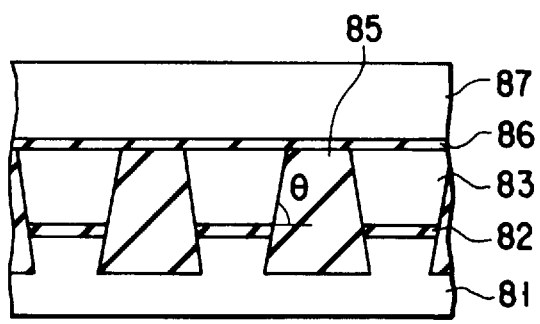
Figure 21D:
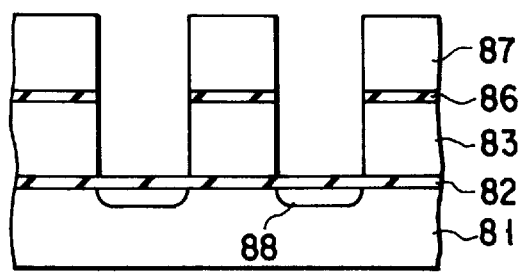

Finally, as shown in FIGS. 20D and 21D, by using the control gate electrode 87 as a mask, n-type impurities are ion implanted into the substrate, so that n-type diffused regions 88 are formed to self-align to the gate electrode. Thus, EEPROM memory cells are completed.

The present embodiment also provides the same advantages as the above-described examples. Further, according to the embodiment, since the area of that surface of the gate insulating layer 82 which is opposed to the floating gate electrode 83 is made smaller than the area of that surface of the intergate insulating layer 86 which is opposed to the floating gate electrode 83, the coupling ratio becomes higher. This allows a voltage to be applied to the control gate electrode 87 at the time of writing/erasing operation to be lowered. Thus, memory cells can be realized which require less power dissipation and have higher reliability.

Figure 22:
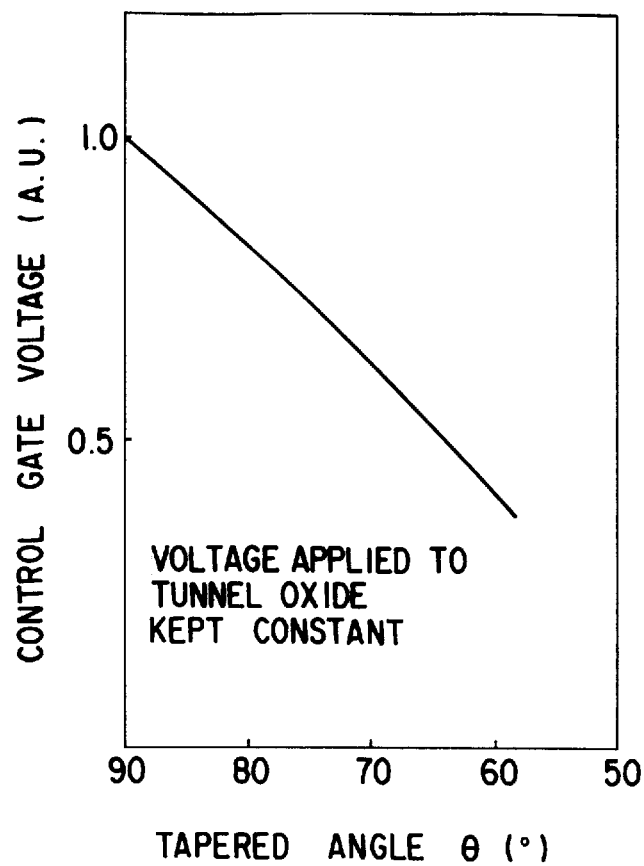
FIG. 22 is a graph illustrating tapered angle versus control gate voltage required to keep the voltage applied to the tunnel oxide layer constant.

FIG. 22 is a graph illustrating by calculations how much the coupling ratio is improved when the above-described structure is taken. That is, FIG. 22 is a relative representation of control gate electrode voltages required to keep the voltage applied to the tunnel oxide layer constant when the taper angle θ (shown in FIG. 20D) is changed with a control gate voltage when θ=90 degrees taken as unity. The calculations were performed on the assumption that the thickness of the tunnel insulating layer is 10 nm, the oxide-converted thickness of the intergate insulating layer is 16 nm, the thickness of the floating gate electrode is 200 nm, and the mask dimension of the width at the top of the floating gate electrode is 0.25 μm.

It will be understood from FIG. 22 that, even with θ=87 degrees, the voltage at the time of writing or erasing operation can be reduced by 5%. With taper angles more than 87 degrees, sufficient results can be expected.

Figure 23A:
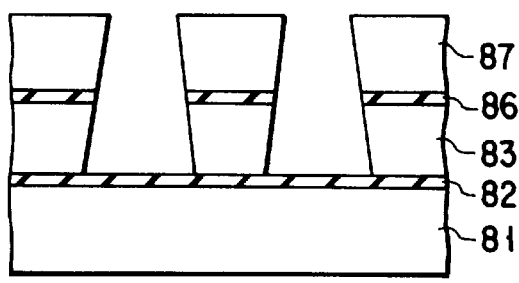
FIGS. 23A and 23B illustrate modifications of the fourth embodiment in which the grooves are tapered in the direction of cell forming regions and correspond in step of manufacture to FIGS. 21C and 21D, respectively.
Figure 23B:
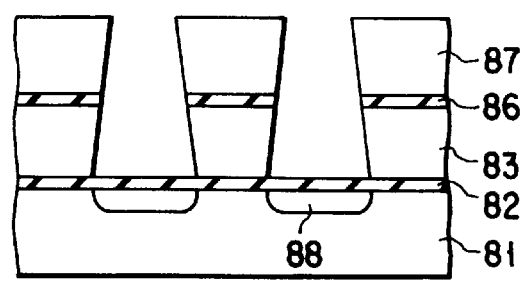

In the above embodiment, only the side surfaces which adjoin the element isolation region are tapered. Of course, the side surfaces in the direction of the element forming region may also be tapered. FIGS. 23A and 23B are sectional views in the direction of the device forming region in the steps corresponding to FIGS. 21C and 21D. In the step of FIG. 23B, when n-type impurities are ion-implanted into the silicon substrate 81 from right above using the control electrode 87 as a mask, there arises a possibility that an offset may occur between the n-type diffused region 88 and the floating gate electrode 83. For this reason, the ion implantation is required to be performed diagonally from above. By doing so, such an EEPROM as shown in FIG. 23B will be obtained.

In any of the above embodiments, the shape of the gate insulating layer and the intergate insulating layer is defined by the steps to form the cell formation/isolation trench and the floating gate electrode. The shape may be defined by other factors. What is important is that at least the first major factor to define the shape should be the same for the gate insulating layer and the intergate insulating layer. For example, after the gate insulating layer and the floating gate electrode are formed on the semiconductor substrate, the cell isolation region may be formed by ion implantation of oxygen and annealing to define the shape of the gate insulating layer and the shape of the surface of the floating gate electrode on which the intergate insulating layer is to be formed.

Next, a NAND type of EEPROM similar in structure to the EEPROM according to the third embodiment will be described. FIGS. 24A through 24D and 25A through 25D are sectional diagrams illustrating another example (Example 3) of a method of manufacturing a NAND type of EEPROM memory cell. FIGS. 24A through 24D and FIGS. 25A through 25D correspond to sectional diagrams taken along line 9—9 and line 10—10, respectively, of FIG. 8.

Figure 24A:
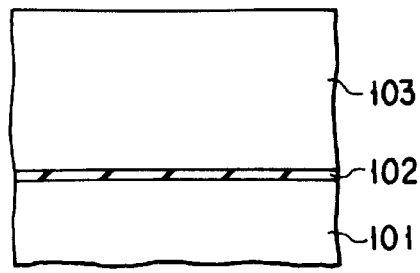
FIGS. 24A through 24E illustrate, in the order of steps of manufacture, a method of manufacturing a NAND type of EEPROM which is similar to the third embodiment and has variations in coupling ratio reduced and correspond to sectional views taken along line 9—9 of FIG. 8.
Figure 25A:
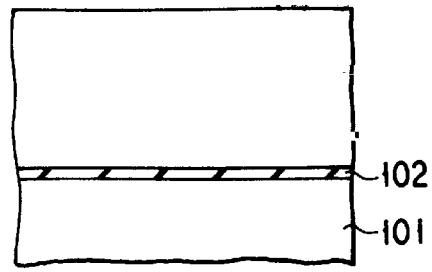
FIGS. 25A through 25E are sectional views corresponding in step of manufacture to FIGS. 24A through 24E, respectively, and correspond to sectional views taken along line 10—10 of FIG. 8.

First, as shown in FIGS. 24A and 25A, a layer 102 of silicon oxide is formed by thermal oxidation over the entire surface of a p-type silicon substrate 101 (for example, resistivity=10 Ωcm, crystal plane=(100)) to a thickness of, say, 10 nm. The silicon oxide layer serves as a gate insulating layer (tunnel oxide). Then, on the gate insulating layer 102 a polycrystalline silicon layer 103 is formed by CVD to a thickness of, say, 600 nm, which serves as a floating gate electrode.

Figure 24B:
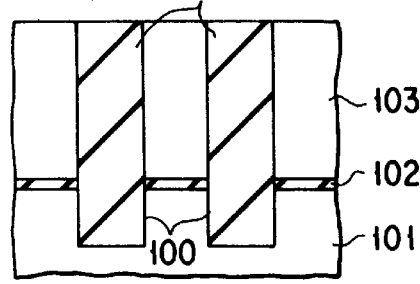
Figure 25B:
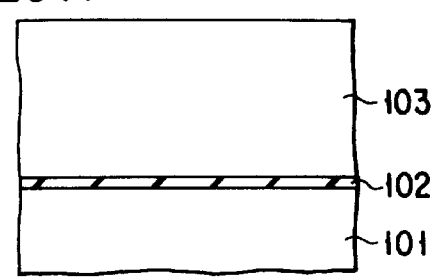

Next, as shown in FIGS. 24B and 25B, the polycrystalline silicon layer 103, the gate insulating layer 102 and the silicon substrate 101 are sequentially etched by reactive ion etching to form a cell isolation trench 100 of a depth of 900 nm.

Next, a silicon oxide layer is formed by CVD over the entire surface, so that the trench 100 is filled with a cell isolation insulating layer 104. Then, a portion of the insulating layer 104 that overflowed the trench 100 is polished by chemical and mechanical polishing until the surface of the floating gate electrode 103 is exposed.

Figure 24C:
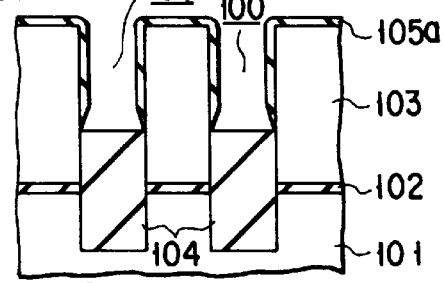
Figure 25C:
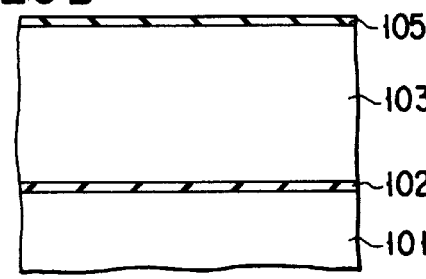

Next, as shown in FIGS. 24C and 25C, the insulating layer 104 within the trench 100 is etched by reactive ion etching until the depth of the trench becomes 400 nm.

Next, the exposed surface of the phosphorus-doped polycrystalline silicon layer 103 is subjected to nitridation in a $NH_3$ gas atmosphere to form a first thin layer 105a of silicon nitride thereon. At this point, the supply amount of $NH_3$ gas to the silicon layer 103 becomes smaller as it goes deeper in the trench. For this reason, the thickness of the silicon nitride layer will be 1 nm on the top surface of the silicon layer 103 and 0.5 nm in the vicinity of the bottom of the trench 100. That is, the deeper the silicon nitride layer 105a is formed in the trench 100, the thinner its thickness becomes. Thus, the average nitrogen concentration of a portion of the silicon nitride layer 105a in the vicinity of the isolation insulating layer 104 becomes lower than that of the other portion.

Figure 24D:
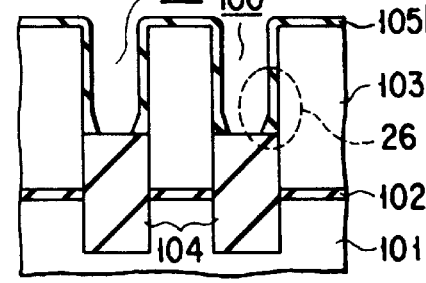
Figure 25D:
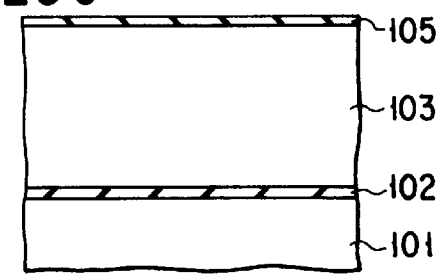

Next, as shown in FIGS. 24D and 25D, the surface of the silicon layer 104 is subjected to thermal oxidation. At this point, the silicon nitride layer 105a changes to a silicon oxynitride layer 105b ($SiO_xN_x$). As shown enlarged in FIG. 26, the thickness of the silicon oxynitride layer 105b varies with varying oxidation speed and becomes 8 nm on the top surface of the silicon layer 103 and 12 nm at the bottom of the trench 100. The deeper the layer 105b is in the trench, the more its thickness increases. That is, the average thickness of a portion of the silicon oxynitride layer 105b in the vicinity of the surface of the isolation insulating layer 104 becomes larger than that of the other portion.

Next, a second layer 105c of silicon nitride is formed by CVD over the surface of the silicon oxynitride layer 105b to a thickness of 8 nm and then subjected to thermal oxidation to form a thin layer 105d of silicon oxide of 5 nm thickness thereon. In this way, a thick intergate insulating layer 105 of three-layered structure is formed in the vicinity of the isolation insulating layer 104.

Figure 24E:
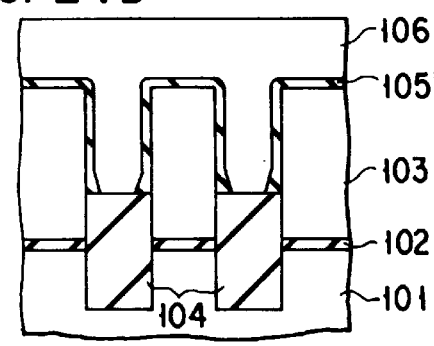
Figure 25E:
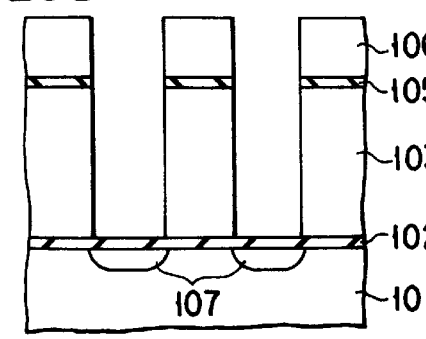

Next, as shown in FIGS. 24E and 25E, a thick layer 106 of polycrystalline silicon of a thickness of, say, 300 nm is formed over the entire surface and its surface is flattened. Then, the silicon layer is doped with phosphorus at a concentration of the order of $3 \times 10^{20}$ cm$^{-3}$.

Next, the polycrystalline silicon layer 106, the intergate insulating layer 105 and the phosphorus-doped polycrystalline silicon layer 103 are sequentially etched by reactive ion etching to form the control gate electrode 106, the intergate insulating layer 105, and the floating gate electrode 103.

Finally, by using the control gate electrode 106 as a mask, arsenic is ion implanted into the silicon substrate 101 to form self-aligned n-type diffused regions 107. Thus, the EEPROM memory cell is completed.

Though it is inferior to the third embodiment, the present example can also make variations in threshold voltage due to variations in coupling ratio very small in comparison with the prior art. Thus, variations in writing/erasing characteristic from cell to cell due to the progress of fine patterning of memory cells can be suppressed effectively to avoid malfunctions.

In this example, when the silicon nitride layer 105a is formed on the floating gate electrode 103, its thickness is controlled by employing that the supply amount of $NH_3$ gas decreases in the depths of the trench. Another method may be used. For example, as shown in FIG. 27A, when the isolation insulating layer 104 within the trench 100 is subjected to anisotropic etching by reactive ion etching, the anisotropic etching is stopped prematurely and the surface of the exposed portion of the silicon layer 103 is subjected to thermal nitridation in an $NH_3$ gas atmosphere to form a thin layer 105a of silicon nitride thereon. Next, as shown in FIG. 27B, the isolation insulating layer 104 is further etched, thereby allowing a desired thin layer of silicon nitride to be formed.

Moreover, in the present example, the thin layer 105b of silicon oxynitride is formed on the surface of the silicon layer (floating gate electrode) 103 by means of thermal oxidation. Alternatively, CVD may be used. In this case, a portion of the intergate insulating layer 105 in the vicinity of the isolation insulating layer 104 can be made thicker than the average thickness of the other portion by difference in thickness of native oxide layers formed in the CVD equipment, and by difference in incubation time before the insulating layer deposition is started.

Although the third and fourth embodiments of the invention are directed to a NAND type of EEPROM memory cell, the invention can be applied to EEPROM memory cells of a type other than NAND type. In addition, the invention can also be applied to a non-volatile semiconductor memory other than EEPROM, for instance, EPROM. In this case as well, the invention can be applied to any type of EPROM.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:
    a substrate having, a convexity;
    a first conductive layer corresponding to at least an upper portion of said convexity, said first conductive layer comprising a first layer, and a second layer formed on said first layer, said first layer and said second layer being included in said convexity and having a same conductivity type;
    a first insulating layer formed on said first conductive layer to cover said convexity; and
    a second conductive layer formed opposed to said convexity with said first insulating layer interposed therebetween to thereby form a capacitive element with said first conductive layer,
    said first insulating layer having a first region having a first capacitance value per unit area that substantially determines a capacitance value of said capacitive element and a second region having a second capacitance value per unit area that is smaller than said first capacitance value per unit area of said first region, and said first region and said second region being respectively formed on said second layer and said first layer of said first conductive layer which is exposed to a side surface of said convexity.

2. The semiconductor device according to claim 1, wherein a second insulating layer is buried around said convexity on said substrate, an edge of a top surface of said second insulating layer is set to be in contact with said first layer of said first conductive layer, and said second region of said first insulating layer is formed above said top surface of said second insulating layer.

3. The semiconductor device according to claim 1, wherein the thickness of said first region of said first insulating layer is thinner than that of said second region, whereby said first capacitance value per unit area of said first region is set larger than said second capacitance value per unit area of said second region.

4. The semiconductor device according to claim 1, wherein the dielectric constant of said first region of said first insulating layer is larger than that of said second region, whereby said first capacitance value per unit area of said first region is set larger than said second capacitance value per unit area.

5. The semiconductor device according to claim 4, wherein said second layer contains a main material and at least one impurity material, and anyone of the dielectric constant of a compound of said impurity material and oxygen and the dielectric constant of a compound of said main material and said impurity material is larger than that of a compound of said main material and oxygen.

6. The semiconductor device according to claim 4, wherein said first layer contains a main material and at least one impurity material, and said impurity material is one of fluorine and an element such that anyone of the dielectric constant of a compound of said impurity material and oxygen and the dielectric constant of a compound of said impurity material and said main material is smaller than that of a compound of said main material and oxygen.

7. The semiconductor device according to claim 1, wherein said first conductive layer, said second conductive layer and said first insulating layer are used as a floating gate electrode, a control gate electrode, and an intergate insulating layer, respectively, of a non-volatile memory cell.

8. The semiconductor device according to claim 1, wherein said first conductive layer, said second conductive layer and said first insulating layer are used as a convex active layer, a gate electrode, and a gate insulating layer, respectively, of a convex MOS transistor.

9. The semiconductor device according to claim 1, wherein said first conductive layer, said second conductive layer and said first insulating layer are used as a first capacitor electrode, a second capacitor electrode, and a capacitor insulating layer, respectively, of a convex capacitor.

10. A semiconductor comprising:
  a semiconductor substrate having a major surface;
  a first insulating layer formed on said major surface of said semiconductor substrate;
  a first electrode formed on said first insulating layer, said first electrode having a first main surface opposing to said first insulating layer and in a shape of a rectangle having four sides;
  a second insulating layer formed on said first electrode, said first electrode having a second main surface opposing to said second insulating layer and in a shape of a rectangle having four sides each of which is parallel to a respective one of said four sides of said first main surface, said second main surface being larger than said first main surface in a length of each of at least one pair of opposed sides; and
  a second electrode formed on said second insulating layer, wherein a stack of said first electrode, said second insulating layer, and said second electrode includes a pair of opposing side surfaces formed such that a dimension of said stack in a direction perpendicular to a stacking direction increases linearly in the stacking direction.

11. A semiconductor device comprising:
  a first conductive layer comprising a first layer and a second layer formed on said first layer and having a concave portion formed in said first layer through said second layer, said first layer and said second layer having a same conductivity type;
  an insulating layer formed inside of said concave portion with said insulating layer interposed therebetween to thereby form a capacitive element with said first conductive layer,
  said insulating layer having a first region having a first capacitance value per unit area that substantially determines a capacitance value of said capacitive element and a second region having a second capacitance value per unit area that is smaller than said first capacitance value per unit area of said first region, and said first region and said second region being respectively formed on said second layer and said first layer of said first conductive layer which is exposed to a side surface of said concave portion.

12. The semiconductor device according to claim 11, wherein a bottom surface of said concave portion is set to be inside of said first layer of said first conductive layer.

13. The semiconductor device according to claim 11, wherein a thickness of said first region of said insulating layer is thinner than that of said second region, whereby said first capacitance value per unit area of said first region is set larger than said second capacitance value per unit area of said second region.

14. The semiconductor device according to claim 11, wherein a dielectric constant of said first region of said insulating layer is larger than that of said second region, whereby said first capacitance value per unit area of said first region is set larger than said second capacitance value per unit area of said second region.

15. The semiconductor device according to claim 14, wherein said second layer contains a main material and at least one impurity material, and anyone of a dielectric constant of a compound of said impurity material and oxygen and a dielectric constant of a compound of said main material and said impurity material is larger than that of a compound of said main material and oxygen.

16. The semiconductor device according to claim 14, wherein said first layer contains a main material and at least one impurity material, and said impurity material is one of fluorine and an element such that anyone of a dielectric constant of a compound of said impurity material and oxygen and a dielectric constant of a compound of said impurity material and said main material is smaller than that of a compound of said main material and oxygen.

17. The semiconductor device according to claim 11, wherein said first conductive layer and said insulating layer are used as a first capacitor electrode, a second capacitor electrode, and a capacitor insulating layer, respectively, of a concave capacitor.

18. The semiconductor device according to claim 1 wherein an impurity concentration of said first layer of said first conductive layer is higher than that of said second layer of said first conductive layer.

19. The semiconductor device according to claim 1, wherein said second layer of said first conductive layer is additively formed on said first layer of said first conductive layer.

20. The semiconductor device according to claim 11, wherein an impurity concentration of said first layer of said first conductive layer is higher than that of said second layer of said first conductive layer.

21. The semiconductor device according to claim 11, wherein said second layer of said first conductive layer is additively formed on said first layer of said first conductive layer.

* * * * *